(12) United States Patent
Ma et al.

(10) Patent No.: US 12,336,289 B2
(45) Date of Patent: Jun. 17, 2025

(54) DISPLAY PANEL AND DISPLAY DEVICE

(71) Applicant: WUHAN TIANMA MICROELECTRONICS CO., LTD., Wuhan (CN)

(72) Inventors: Yufang Ma, Wuhan (CN); Zihui Yuan, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 489 days.

(21) Appl. No.: 18/054,206

(22) Filed: Nov. 10, 2022

(65) Prior Publication Data
US 2023/0207572 A1 Jun. 29, 2023

(30) Foreign Application Priority Data
Jun. 30, 2022 (CN) .......................... 202210770796.3

(51) Int. Cl.
*H10D 86/40* (2025.01)
*G09G 3/32* (2016.01)
*H10D 86/60* (2025.01)

(52) U.S. Cl.
CPC .......... *H10D 86/60* (2025.01); *H10D 86/441* (2025.01); *G09G 3/32* (2013.01); *G09G 2300/0426* (2013.01); *G09G 2300/0819* (2013.01); *G09G 2300/0842* (2013.01); *G09G 2300/0861* (2013.01)

(58) Field of Classification Search
CPC ........ H10D 86/60; H10D 86/441; G09G 3/32; G09G 2300/0426; G09G 2300/0819; G09G 2300/0842; G09G 2300/0861; G09G 3/20; G09G 3/30
See application file for complete search history.

(56) References Cited

U.S. PATENT DOCUMENTS

| | | | |
|---|---|---|---|
| 10,725,344 B1* | 7/2020 | Wu | G02F 1/13338 |
| 2015/0173232 A1* | 6/2015 | Chai | G02F 1/1345 |
| | | | 361/748 |
| 2016/0104692 A1* | 4/2016 | Lee | G02F 1/13452 |
| | | | 257/773 |
| 2023/0165091 A1* | 5/2023 | Xu | H10K 59/1201 |
| | | | 257/91 |

FOREIGN PATENT DOCUMENTS

| | | |
|---|---|---|
| CN | 111477675 A | 7/2020 |
| CN | 113964142 A | 1/2022 |

* cited by examiner

*Primary Examiner* — Pegeman Karimi
(74) *Attorney, Agent, or Firm* — CHRISTENSEN O'CONNOR JOHNSON KINDNESS PLLC

(57) ABSTRACT

Display panel and display device are described. In an embodiment, the display panel includes data lines located in a display area; and fan-out lines connected to the data lines and located in a non-display area. In an embodiment, the display area includes first display areas and a second display area. In an embodiment, one of the first display areas, the second display area and another one of the first display areas are arranged along a first direction. In an embodiment, the data lines include edge data lines located in the first display areas and connected to the fan-out lines through connection leads located in the display area.

20 Claims, 27 Drawing Sheets

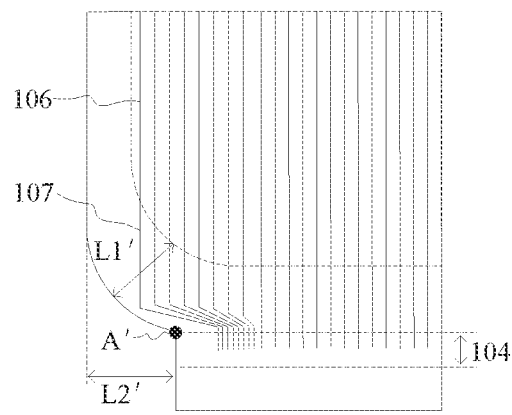 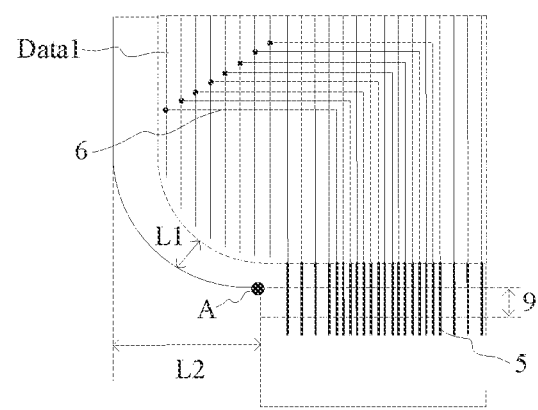
FIG. 3A (Prior art)  FIG. 3B
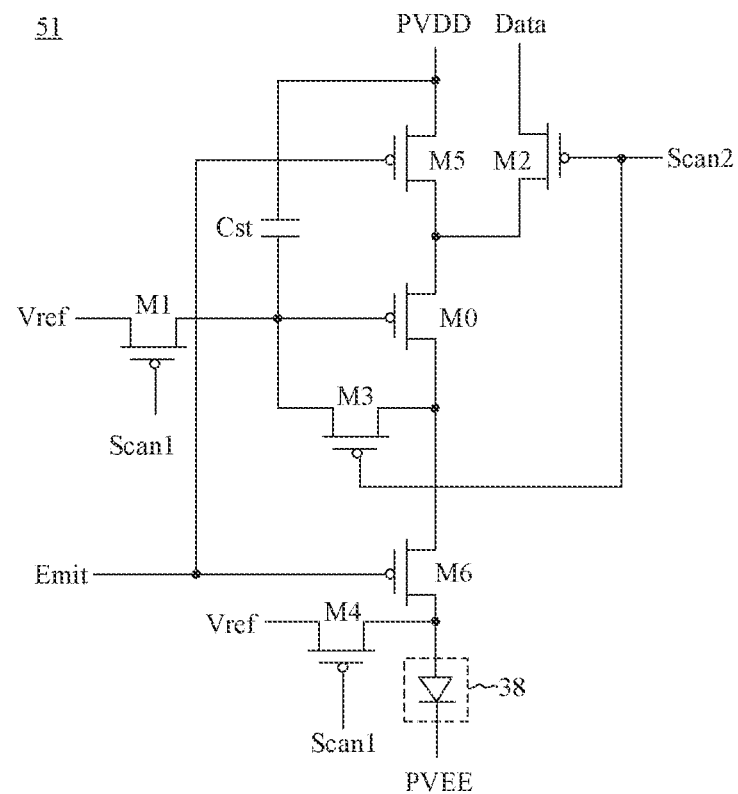
FIG. 4

DISPLAY PANEL AND DISPLAY DEVICE

CROSS-REFERENCE TO RELATED APPLICATIONS

The present application claims to the benefit of Chinese Patent Application No. 202210770796.3, filed on Jun. 30, 2022, the content of which is incorporated herein by reference in its entirety.

TECHNICAL FIELD

The present disclosure relates to the technical field of displays, and in particular, to a display panel and a display device.

BACKGROUND

In recent years, a display-to-body ratio of a display panel has increased.

However, in conventional display panels, a fan-out line of the display panel may consume a large frame width in a non-display area, thereby limiting a full-screen design of the display panel.

SUMMARY

In view of the above, a display panel and a display device are provided in embodiments of the present disclosure, which are configured to further reduce a frame width of the display panel and optimize a full-screen design.

In a first aspect, an embodiment of the present disclosure provides a display panel, including: data lines located in a display area of the display panel; and fan-out lines electrically connected to the data lines and located in a non-display area of the display panel. The display area includes first display areas and a second display area. In an embodiment, one of the first display areas, the second display area and another one of the first display areas are arranged along a first direction, and the first display areas are adjacent to the non-display area. In an embodiment, the data lines include edge data lines located in at least one of the first display areas and electrically connected to the fan-out lines through connection leads, and the connection leads are located in the display area. In an embodiment, for one of the connection leads, the connection lead includes a first end electrically connected to the edge data line and a second end electrically connected to the fan-out line; and the second end of the connection lead is located at a side, adjacent to the second display area, of the edge data line electrically connected to the connection lead.

In a second aspect, an embodiment of the present disclosure provides a display device including a display panel, and the display penal includes: data lines located in a display area of the display panel; and fan-out lines electrically connected to the data lines and located in a non-display area of the display panel. In an embodiment, the display area includes first display areas and a second display area. In an embodiment, one of the first display areas, the second display area and another one of the first display areas are arranged along a first direction, and the first display areas are adjacent to the non-display area. In an embodiment, the data lines include edge data lines located in at least one of the first display areas and electrically connected to the fan-out lines through connection leads, and the connection leads are located in the display area. In an embodiment, for one of the connection leads, the connection lead includes a first end electrically connected to the edge data line and a second end electrically connected to the fan-out line; and the second end of the connection lead is located at a side, adjacent to the second display area, of the edge data line electrically connected to the connection lead.

BRIEF DESCRIPTION OF DRAWINGS

In order to better illustrate technical schemes of the embodiments of the present disclosure, the drawings used in the embodiments will be briefly introduced below. It should be noted that, the drawings in the following description merely illustrate some of the embodiments of the present disclosure, and other drawings may be obtained for those of ordinary skill in the art according to these drawings without paying creative efforts.

FIG. 3A illustrates wiring of a display panel in the related art;

FIG. 3B illustrates wiring of a display panel according to an embodiment of the present disclosure;

FIG. 4 is a schematic diagram of a circuit structure of a pixel circuit according to an embodiment of the present disclosure;

DESCRIPTION OF EMBODIMENTS

In order to better illustrate technical schemes of the present disclosure, embodiments of the present disclosure will be described in detail below with reference to the drawings.

It should be clear that the described embodiments herein are only part of the embodiments of the present disclosure, but not all of them. On a basis of the embodiments in the present disclosure, all other embodiments obtained by the ordinary skilled in the art without paying creative effort shall fall within a scope of the present disclosure.

Terms used in the embodiments of the present disclosure are only for the purpose of describing specific embodiments, but not intended to limit the present disclosure. Singular forms of "a", "said" and "the" used in the embodiments of the present disclosure and the appended claims are also intended to include a plural form, unless the context clearly indicates other meaning otherwise.

It should be understood that a term "and/or" used herein in the embodiments is only a kind of association relationship to describe associated objects, which means that there can be three kinds of relationships, for example, A and/or B, which can indicate only A, A and B. and only B. In addition, a character "/" used herein in the embodiments generally indicates that associated object are in an "or" relationship.

To realize normal image display of the display panel, data lines are arranged in a display area of the display panel, and these data lines are led to pins through fan-out lines extending in a non-display area of the display panel, so as to realize electrical connection with the pins to receive data voltages provided by the pins. The applicant has found that a configuration manner of the fan-out lines in the non-display area in the related dart is not conducive to optimizing a size design of the non-display area, which results in a large frame width for the display panel.

Figure 1:
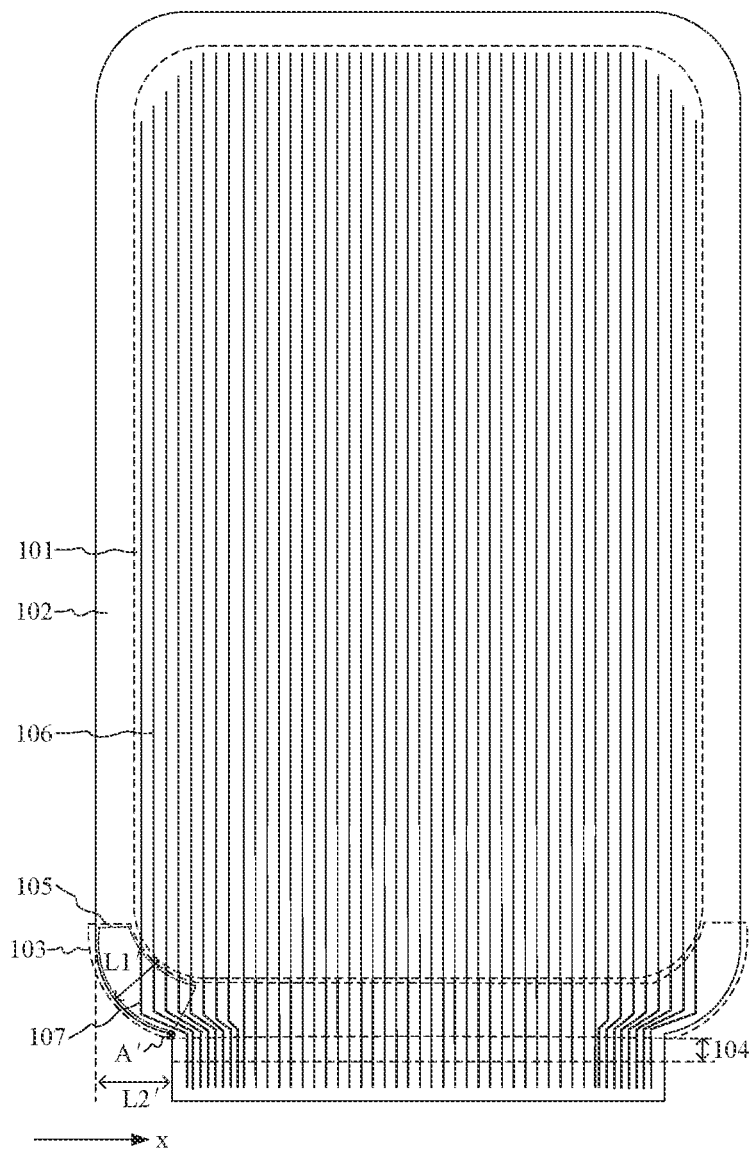
FIG. 1 is a top view of a display panel in the related art.

A display panel with a rounded rectangle is taken as an example. As shown in FIG. 1, which is a top view of a display panel in the related art, the display panel includes a display area 101 and a non-display area 102. The non-display area 102 includes a lower frame area 103 and a bending area 104. The lower frame area 103 includes a corner area 105. The corner area 105 is located at a corner of the display panel and is also called an R-corner area, and the corner area 105 has an arc-shaped edge. The bending area 104 is an area for bending in the non-display area 102 to bend the printed circuit board to a back side of the display panel. It can be understood that the with the bending area 104, a part of the non-display area of the display panel can be bent to the back side of the display area to realize electrical connection between a signal line in the display panel and a driver chip or printed circuit board, thereby reducing an area of a front step region of the display panel and increasing the display-to-body ratio.

The display area 101 includes data lines 10. As for the data lines 106 adjacent to a lower side of the display area 101, an end of each of the data lines is electrically connected to a fan-out line 107 in the non-display area 102. As for data lines 106 adjacent to left and right edges of the display area 101, the fan-out lines 107 connected to these data lines 106 need to be bent at a certain angle in the corner area 105 and then led to the bending area 104, and as a result, these fan-out lines 107 consume a larger corner width L1 in the corner area 105, thereby leading to a large overall width of the lower frame area 103.

Furthermore, when the width of the corner area 105 is large, a radian of the edge of the corner area 105 is small. As a result, when designing the bending area 104, a starting point A' of the bending area 104 is close to an extension line of the edge of the display panel. In the field of displaying, a distance L2 between the starting point of the bending area 104 and the extension line of the edge of the display panel is called an L-Cut specification of the display panel. The smaller the L-Cut specification of the display panel, the larger a designed size of the bending area 104 in the first direction X, which results in a larger proportion of an invalid non-display area in the whole display panel and a wider frame, which is not conducive to a whole display panel design.

Therefore, an embodiment of the present disclosure provides a display panel, which reduces the frame width of the display panel based on a wiring design in the display panel.

Figure 2:
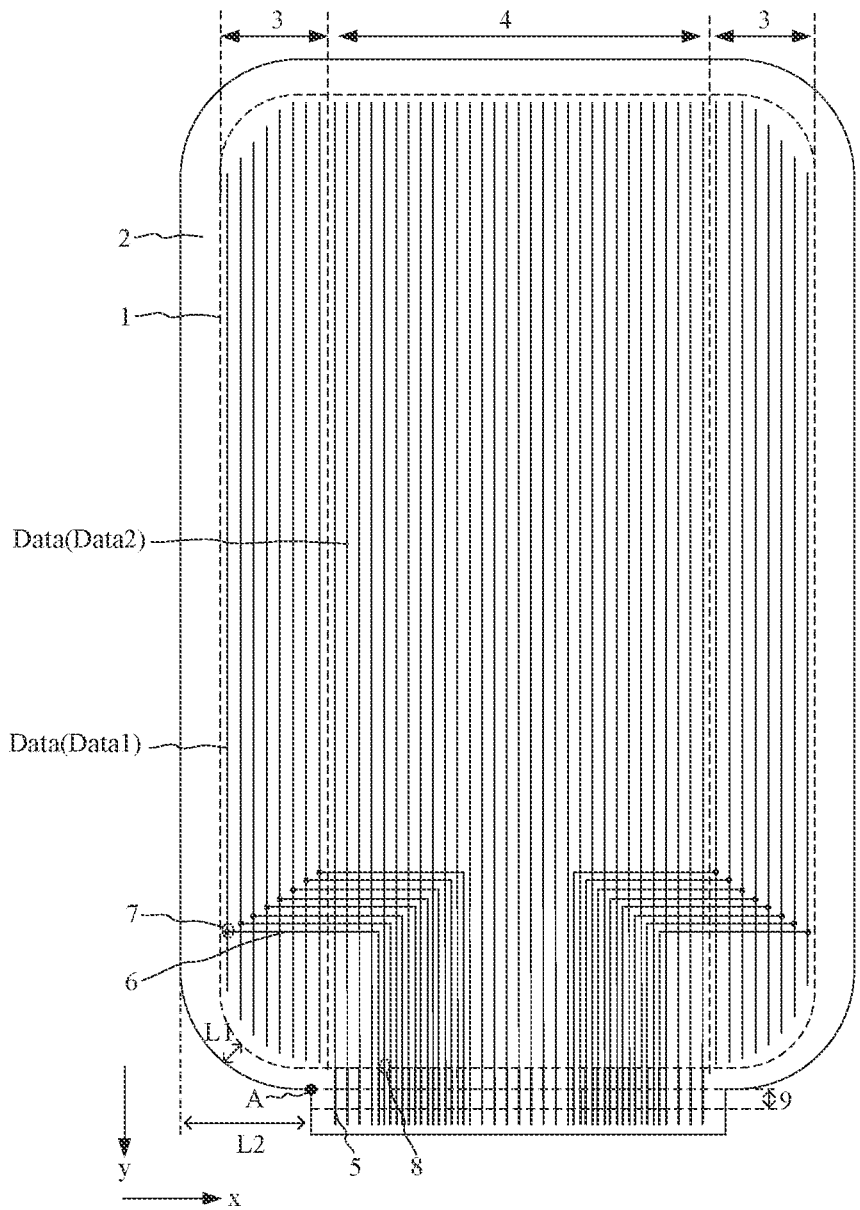
FIG. 2 is a top view of a display panel according to an embodiment of the present disclosure.

As shown in FIG. 2, which is a top view of a display panel according to an embodiment of the present disclosure, the display panel includes a display area 1 and a non-display area 2, and the display area 1 includes at least one first display area 3 a second display area 4. In an example, the at least one first display area 3 includes two first display areas 4. One of the two first display areas 3, the second display area 4 and another one of the two first display areas 3 are arranged along the first direction X, and the two first display areas 3 are adjacent to the non-display area 2. That is, the two first display areas 3 are edge display areas on two sides, an edge of one of the two first display areas 3 is a boundary between the display area 1 and the non-display area 2, and the second display area 4 is a middle display area.

Figure 26:
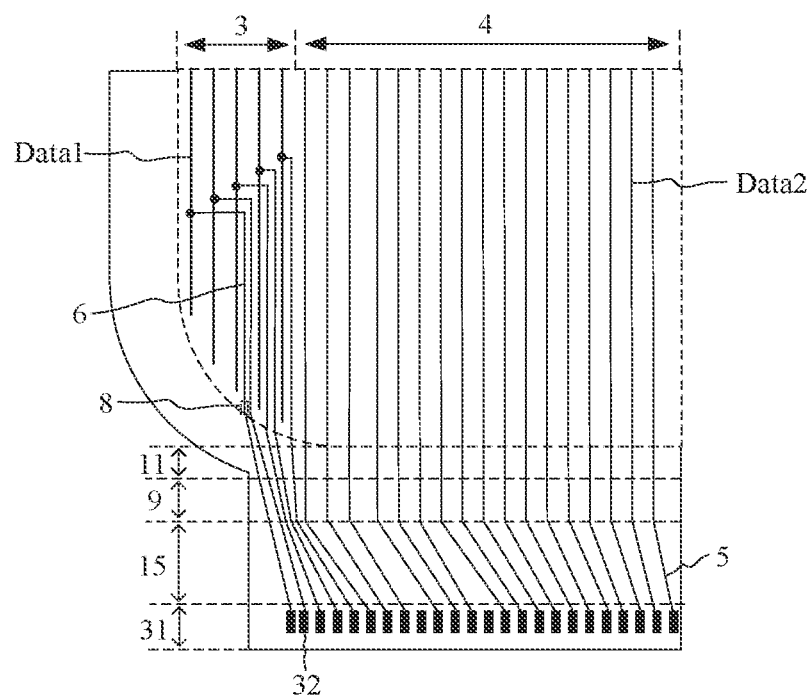
FIG. 26 is yet another partial top view of a display panel according to an embodiment of the present disclosure.

In some embodiments, the display panel includes data lines Data located in the display area 1 and fan-out lines 5 located in the non-display area 2, and the fan-out lines 5 are electrically connected to the data lines Data. With reference to FIG. 26, in some embodiments, the non-display area 2 includes a binding area 31, and the fan-out lines 5 extend to the binding area 31 to be electrically connected to pins 32 located in the binding area 31, to transmit data voltages provided by the pins 32 to the data lines Data ranged in the display area 1.

The data lines DATA includes an edge data line Data1, the edge data line Data1 is located in at least one first display area 3, and the edge data line Data1 is electrically connected to the fan-out line 5 through a connection lead 6. The connection lead 6 is located in the display area 1. The connection lead 6 includes a first end 7 electrically connected to the edge data line Data1 and a second end 8 electrically connected to the fan-out line 5. The second end 8 of the connection lead 6 is located at a side, adjacent to the second display area 4, of the edge data line Data1 electrically connected to the connection lead 6.

Different from the wiring shown in FIG. 3A, in an embodiment of the present disclosure, as shown in FIG. 3B, the edge data line Data1 located on one of two sides of the display area 1 is not directly connected to the fan-out line 5 at a boundary between the display area 1 and the non-display area 2, but is connected to the fan-out line 5 through a connection lead 6 extending in the display area 1. As the connection lead 6 extends, the connection lead 6 can lead the second end 8 connected to the fan-out line 5 to a side away from an edge of the display area 1. For example, to a side of the first display area 3 adjacent to the second display area 4 or directly to the second display area 4. In this way, at least one of fan-out lines 5 connected to the edge data line Data1 can be directly led out from a lower side of the first display area 3 adjacent to the second display area 4 or directly from a lower side of the second display area 4, without extending into the corner area to realize connection with the edge data line Data1, thus without consuming any width of the corner area. In this way, a width L1 of the corner area can be greatly reduced, and then a width of a lower frame of the display panel can be reduced.

Furthermore, with a reduced width of the corner area, a curved edge of the corner area can have a larger bending radian, so that a distance L2 between a starting point A of a bending area 9 and the edge of the display panel can be increased to a certain extent, that is, a L-Cut specification of the display panel can be increased. After the L-Cut specification of the display panel is increased, a whole proportion of an invalid non-display area in the display panel is reduced. This not only reduces a length of a lower step region of the display panel along the y direction, but also reduces a length of the lower step region of the display panel along the x direction. In this way, an overall design of the display panel can be enhanced, especially an overall design of a plane with a dual-edge curved or quad-edge curved screen. Moreover, it brings higher process yield to the display panel.

Figure 5:
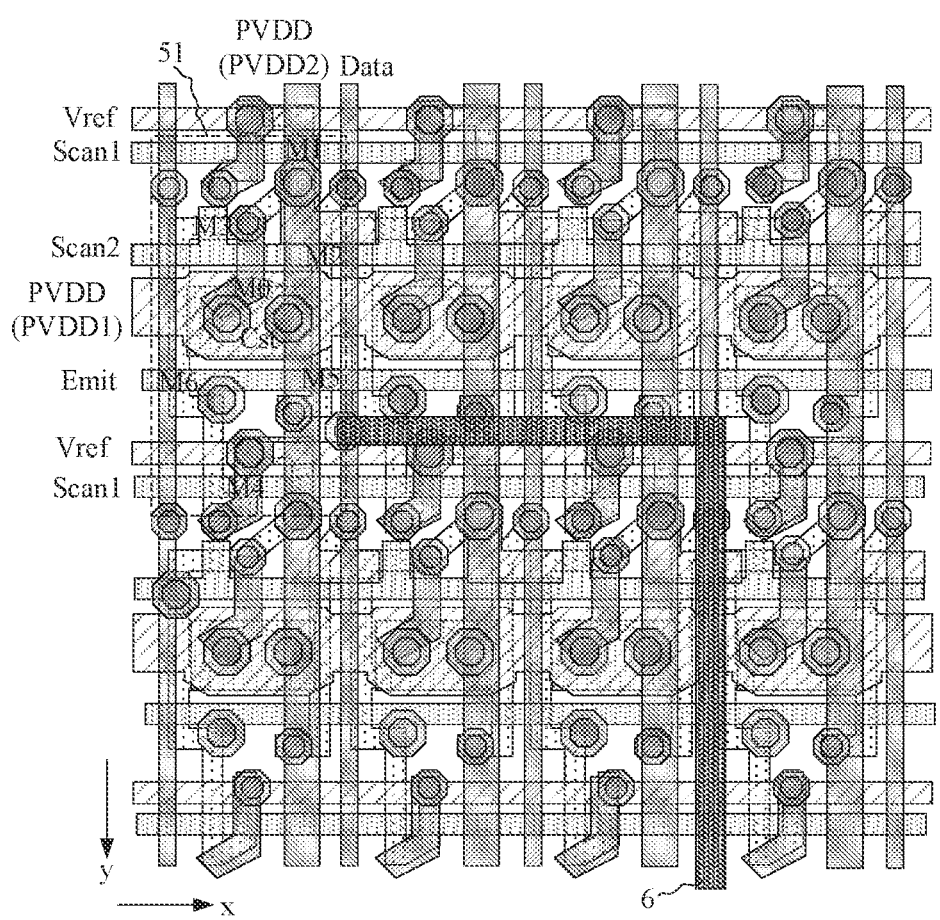
FIG. 5 is a top view of a layer structure of a display panel according to an embodiment of the present disclosure.

FIG. 4 is a schematic diagram of a circuit structure of the pixel circuit 51 according to an embodiment of the present disclosure, and FIG. 5 is a top view of a layer structure of the display panel according to an embodiment of the present disclosure. As shown in FIG. 4 and FIG. 5, the display area 1 includes pixel circuits 51 and various signal lines electrically connected to the pixel circuits 51. The various signal lines may include a first scanning signal line Scan1, a second scanning signal line Scan1, a reset signal line Vref, a light-emitting control signal line Emit, a positive power signal line PVDD and a data line Data. The positive power signal line PVDD includes a first positive power signal line PVDD1 extending in the first direction X and a second positive power signal line PVDD2 extending in the second direction Y.

In a circuit structure of the pixel circuit, referring to FIG. 4, the pixel circuit 51 may include a storage capacitor Cst, a driving transistor M0, a gate reset transistor M1, a data writing transistor M2, a threshold compensation transistor M3, an anode reset transistor M4, a first light emission control transistor M5, and a second light emission control transistor M6. Connection relationships between the above-described transistors and signal lines are the same as those of the related art, which will not be repeatedly described herein.

Figure 6:
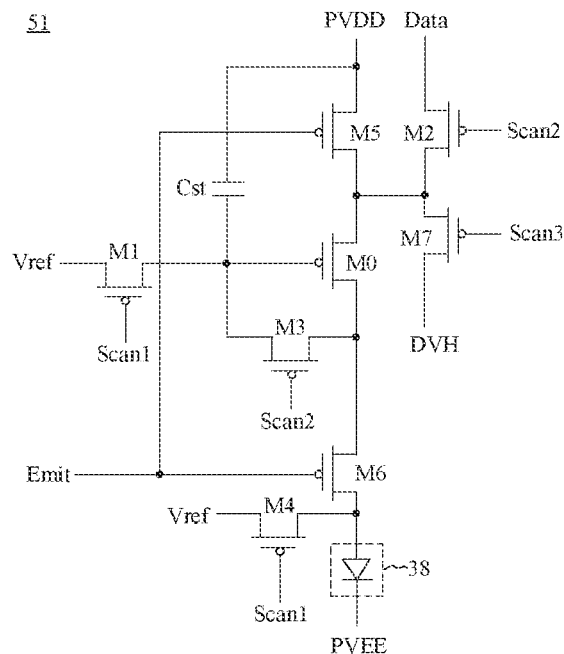
FIG. 6 is a schematic diagram of another circuit structure of a pixel circuit according to an embodiment of the present disclosure.

In some embodiments, in another circuit structure of the pixel circuit, as shown in FIG. 6, which is a schematic diagram of another circuit structure of a pixel circuit 51 according to an embodiment of the present disclosure, the pixel circuit 51 includes a regulating transistor M7 except for the above-described transistors. A gate of the regulating transistor M7 is electrically connected to a third scanning signal line, a first electrode of the regulating transistor M7 is electrically connected to a regulating signal line DVH, and a second electrode of the regulating transistor M7 is electrically connected to a first electrode of the driving transistor M0.

Before resetting a gate of the driving transistor M0, a bias voltage provided by the regulating signal line DVH can be written into the first electrode of the driving transistor M0 by controlling the regulating transistor M7 to be turned on, to refresh a potential of the first electrode of the driving transistor M0, so that device characteristics of the driving transistor M0 can be set to a certain initial state, and an influence of a data signal written in a previous frame on the device characteristics of the driving transistor M0 can be eliminated. After the data voltage is written into the driving transistor M0, a voltage of the first electrode of the driving transistor M0 may leak, especially under driving at a low frequency, which leads to a large deviation of the potential of the first electrode of the driving transistor M0. At this time, by controlling the regulating transistor M7 to be turned on and writing the bias voltage into the first electrode of the driving transistor M0 using the regulating transistor M7, a bias state of the driving transistor M0 can be kept consistent with a bias state when the data voltage is just written, to improve stability of the driving transistor M0 in an operation state.

Figure 7:
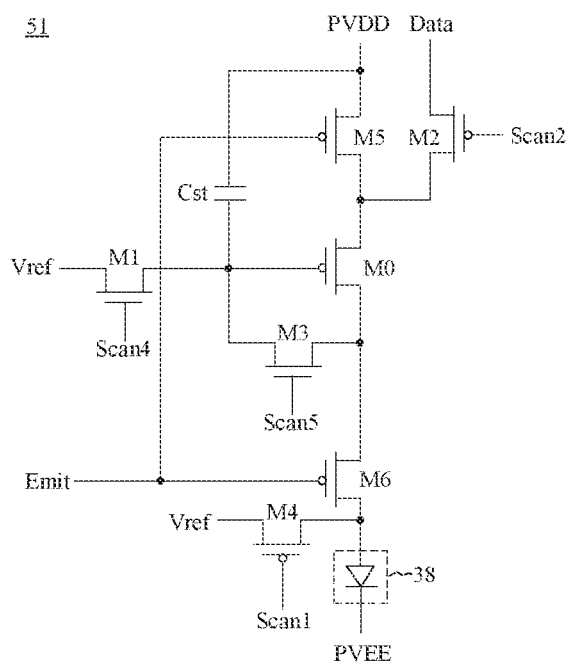
FIG. 7 is a schematic diagram of yet another circuit structure of a pixel circuit according to an embodiment of the present disclosure.

FIG. 7 is a schematic diagram of yet another circuit structure of a pixel circuit 51 according to an embodiment of the present disclosure. As shown, the gate reset transistor M1 and the threshold compensation transistor M3 is configured as Indium Gallium Zinc Oxide (IGZO) transistors. Such a configuration to reduces an influence of leakage currents of the gate reset transistor M1 and the threshold compensation transistor M3 on the potential of the gate of the driving transistor M0 and improves the stability of the driving transistor M0 in an operation state. In the illustrated embodiment, a gate of the gate reset transistor M1 is electrically connected to a fourth scanning signal line Scan4, and a gate of the threshold compensation transistor M3 is electrically connected to a fifth scanning signal line Scan5. In addition, in this structure, other transistors can be Low Temperature Poly-silicon (LTPS) transistors.

The display area 1 is provided with a plurality of metal layers for forming the above-described transistors and signal lines. For example, the display panel includes a first metal layer for forming the first scanning signal line Scan1, the second scanning signal line Scan2 and the light-emitting control signal line Emit, a second metal layer for forming the reset signal line Vref and the first positive power signal line PVDD1, and a third metal layer for forming the second positive power signal line PVDD2 and the data line Data. The second metal layer is located at a side of the first metal layer facing a light-exiting direction of the display panel, and the third metal layer is located at a side of the second metal layer facing the light-exiting direction of the display panel.

In an embodiment of the present disclosure, the connection lead 6 is arranged in a different layer from the metal layers described above, for example, the connection lead 6 is located in a fourth metal layer, and the fourth metal layer is located at a side of the third metal layer facing the light-exiting direction of the display panel. With this configuration, on the one hand, a short circuit between the connection lead 6 and metal wiring in other metal layers can be avoided; and on the other hand, a wiring design of the connection lead 6 does not affect a wiring design of the metal wiring in other metal layers, for example, without needing to increase a spacing between the metal wiring to arrange the connection lead 6.

In some embodiments, the display panel may further include a third positive power signal line, the third positive power signal line is located at a side of the third metal layer facing the light-exiting direction of the display panel, and the third positive power signal line, the second positive power signal line PVDD2 and the first positive power signal line PVDD1 are electrically connected to further reduce a load of the power signal line PVDD. In this case, the connection lead 6 may be arranged in a same layer as the third positive power signal line.

In some other embodiments, the connection lead 6 is not be arranged in a same layer as other structures, and the fourth metal layer where the connection lead 6 is located is an additional metal layer in the display panel.

With reference to FIGS. 10, 12, 14 and 17, in some embodiments, the display panel includes a first insulating layer 91 located between the first metal layer and the second metal layer, a second insulating layer 92 located between the second metal layer and the third metal layer, and a third insulating layer 93 located between the third metal layer and the fourth metal layer. When relevant technical solutions of FIGS. 10, 12, 14, and 17 are subsequently explained, they will be illustrated with reference to a specific metal layer where the fan-out wire 5 is located.

In a possible embodiment, referring to FIG. 2 again, the second end 8 of at least one connection lead 6 is located in the second display area 4.

With this configuration, on the one hand, the second display area 4 is farther away from the corner area of the display panel, and the second end of the connection lead is led to the second display area 4, so that the fan-out line 5 extending in the corner area can be reduced to a greater extent, which is more conducive to reducing the width of the frame area; and on the other hand, compared with the first display area 3, a length of the second display area 4 in the first direction x is larger, so there will be a larger arrangement space when the connection lead 6 is led to the second display area 4.

Figure 8:
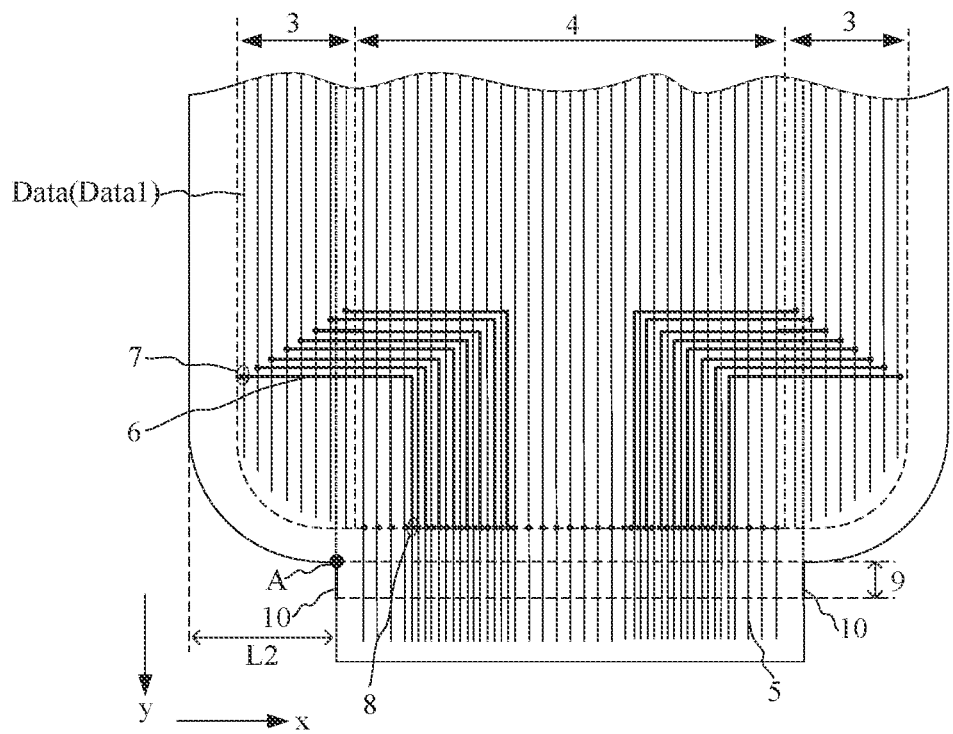
FIG. 8 is a partial top view of a display panel according to an embodiment of the present disclosure.

FIG. 8 is a partial top view of a display panel according to an embodiment of the present disclosure. As shown, the non-display area 2 includes a bending area 9, and a length of the bending area 9 in the first direction x is smaller than a length of the display area 1 in the first direction x. The bending area 9 includes two first edges 10 arranged opposite to each other in the first direction x, and the second end 8 of each connection lead 6 is located between extension lines of the two first edges 10.

When the second end 8 of each connection lead 6 is located between the extension lines of the two first edges 10 of the bending area 9, the fan-out wire 5 connected to the edge data line Data1 can directly extend towards the bending area 9 along the second direction y, without bending in the corner area firstly and then extending to the bending area 9. With this configuration, the starting point A of the bending area 9 can be further retracted, to further increase the L-Cut specification of the display panel.

Figure 9:
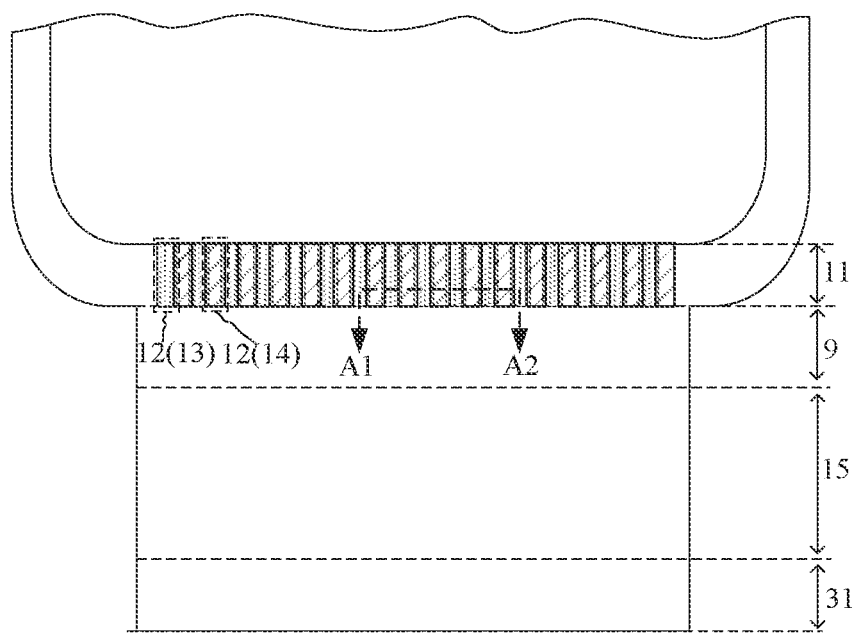
FIG. 9 is a schematic diagram illustrating wiring of a first fan-out area according to an embodiment of the present disclosure.
Figure 10:
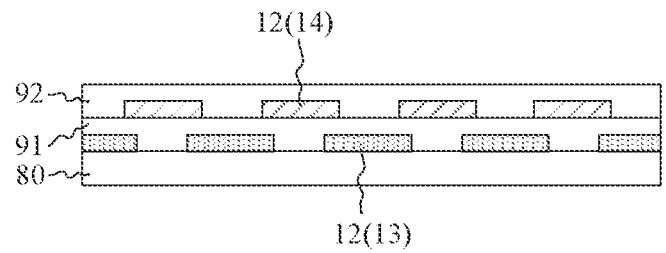
FIG. 10 is a cross-sectional view taken along A1-A2 shown in FIG. 9 according to an embodiment of the present disclosure.

FIG. 9 is a schematic diagram illustrating wiring of a first fan-out area according to an embodiment of the present disclosure, and FIG. 10 is a cross-sectional view taken along A1-A2 shown in FIG. 9. In a possible implementation, as shown in FIG. 9 and FIG. 10, the non-display area 2 includes a bending area 9 and a first fan-out area 11. The first fan-out area 11 is located between the bending area 9 and the display area 1.

The fan-out line 5 includes a first line segment 12 located in the first fan-out area 11. For multiple fan-out lines 5, the first line segments 12 include a type-A first line segment 13 and a type-B first line segment 14, the type-A first line segment 13 and the type-B first line segment 14 are arranged in different layers, and the type-A first line segment 13 overlaps with the type-B first line segment 14 in a direction perpendicular to a plane of the display panel. In an example, referring to FIG. 10, when the type-A first line segment 13 is located in the first metal layer and the type-B first line segment 14 is located in the second metal layer, a first insulating layer 91 is arranged between the type-A first line segment 13 and the type-B first line segment 14, and in some embodiments, a second insulating layer 92 is provided at a side of the type-B first line segment 14 facing away from the first insulating layer 91.

With a continuously increased resolution of the display panel, there are more and more data lines Data in the display panel. Correspondingly, there are more and more fan-out lines 5. If the first line segments 12 located in the first fan-out area 11 are arranged in a same layer, an enough space is required between two adjacent first line segments 12 to avoid short circuit between the first line segments 12. In that case, the wiring of the first line segments 12 needs a large space, and then the bending area 9 needs a large length in the first direction x, which is not conducive to a L-Cut specification design of the display panel.

According to an embodiment of the present disclosure, first line segments 12 of the fan-out lines 5 are arranged in different layers and overlap with each other, so that a total width consumed by the first line segments 12 in the first direction X can be reduced on a premise of avoiding contact short circuit between the first line segments 12, thus facilitating further optimizing of the size design of the bending area 9.

Figure 11:
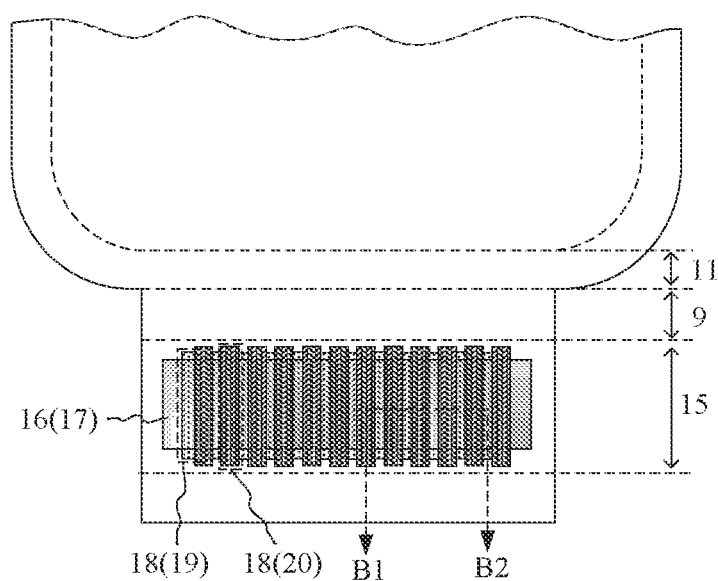
FIG. 11 is a schematic diagram illustrating wiring of a second fan-out area according to an embodiment of the present disclosure.
Figure 12:
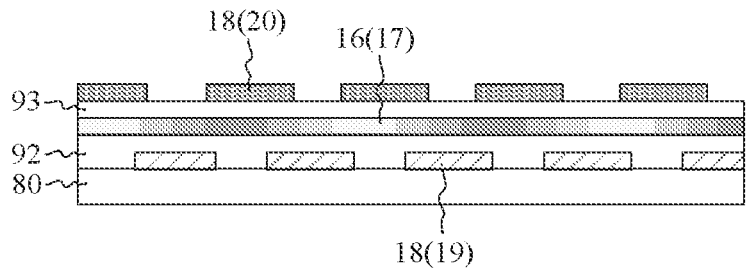
FIG. 12 is a sectional view taken along B1-B2 shown in FIG. 11 according to an embodiment of the present disclosure.

FIG. 11 is a schematic diagram illustrating wiring of a second fan-out area according to an embodiment of the present disclosure, and FIG. 12 is a cross-sectional view taken along B1-B2 shown in FIG. 11. In a possible implementation, as shown in FIG. 11 and FIG. 12, the display panel also includes a substrate 80, and the non-display area 2 includes a bending area 9 and a second fan-out area 15. The second fan-out area 15 is located at a side of the bending area 9 away from the display area 1, and the second fan-out area 15 is provided with a power bus 16 for transmitting a power signal, and the power bus 16 includes a first bus part 17.

The fan-out line 5 includes a second line segment 18 located in the second fan-out area 15, and the second line segment 18 overlaps with the first bus part 17 in the direction perpendicular to the plane of the display panel. The second line segments 18 include a type-A second line segment 19 and a type-B second line segment 20. The type-A second line segment 19 is located at a side of the first bus part 17 facing the substrate 80, and the type-B second line segment 20 is located at a side of the first bus part 17 facing away from the substrate 80. In an example, referring to FIG. 12, when the first bus part 17 is located in the third metal layer, the type-A second line segment 19 is located in the second metal layer, and the type-B second line segment 20 is located in the fourth metal layer, a second insulating layer 92 is arranged between the type-A second line segment 19 and the first bus part 17, and a third insulating layer 93 is arranged between the first bus part 17 and the type-B second line segment 20.

In the above-described configuration, the first bus part 17 can serve as a shielding metal layer to reduce coupling between the type-A second line segment 19 and the type-B second line segment 20, thereby reducing parasitic capacitance generated between the type-A second line segment 19 and the type-B second line segment 20, reducing a load of the fan-out line 5, and thus effectively reducing delay and attenuation of a signal of the data line Data in transmission.

The non-display area 2 includes a first fan-out area 11 and a second fan-out area 15 located at two sides of the bending area 9. A reason for optimized design of the fan-out line 5 being selected to be made in the second fan-out area 15 by using the power bus 16 in the embodiment of the present disclosure is as follows. Based on a position difference between the first fan-out area 11 and the second fan-out area 15, the first fan-out area 11 does not bend with the bending area 9, but remains on a front of the display panel; and thus, in order to better realize a narrow frame design of the display panel, a width of the first fan-out area 11 in the second direction y is generally small, which is significantly smaller than a width of the second fan-out area 15 in the second direction y. Therefore, with the above-described wiring design of the second line segment 18 and the power bus 16 in the second fan-out area 15, on the one hand, there is enough space in the second fan-out area 15 for arranging the power bus 16, so that the power bus 16 can be wider, which not only reduces the load of the power bus 16 to a greater extent, but also realizes stronger shielding ability for the type-A second line segment 19 and the type-B second line segment 20; and on the other hand, with the second line segments 18 being arranged in at least two different layers, the second fan-out area 15 can have enough space to arrange a through-hole for wiring change between the second line segment 18 and the wiring that is located in the bending area 9, and to arrange a through-hole for wiring change between the second line segment 18 and the wiring that is located at a side of the second fan-out area 15 away from the bending area 9.

Figure 13:
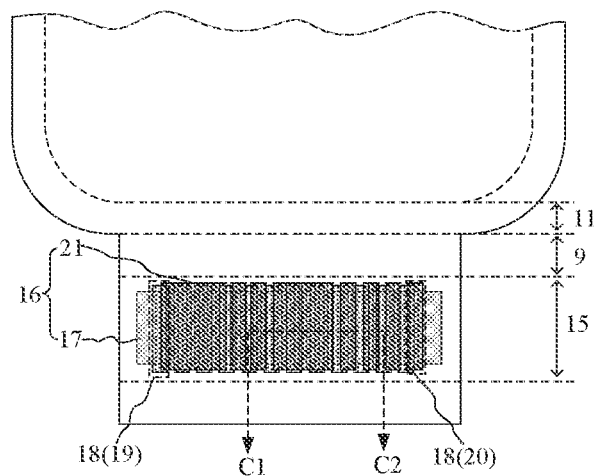
FIG. 13 is a schematic diagram illustrating another wiring of a second fan-out area according to an embodiment of the present disclosure.
Figure 14:
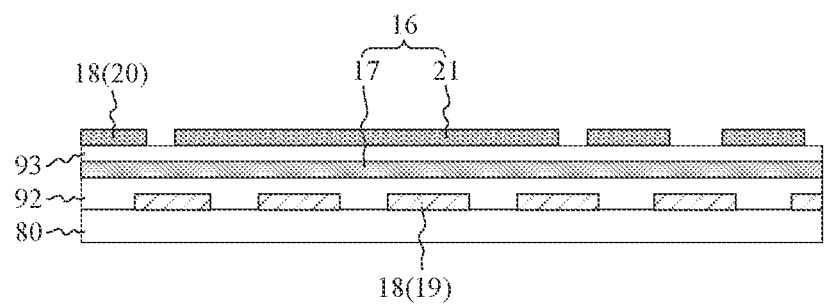
FIG. 14 is a cross-sectional view of FIG. 13 taken along C1-C2 according to an embodiment of the present disclosure.

FIG. 13 is a schematic diagram illustrating another wiring of a second fan-out area 15 according to an embodiment of the present disclosure and FIG. 14 is a cross-sectional view taken along a C1-C2 direction of FIG. 13. In some embodiments, as shown in FIG. 13 and FIG. 14, the power bus 16 further includes a second bus part 21. In the direction perpendicular to the plane of the display panel, the second bus part 21 overlaps with the first bus part 17, and the second bus part 21 is electrically connected to the first bus part 17 (not shown in the figures). The second bus part 21 is arranged in a same layer as the type-B second line segment 20, and a spacing is formed between the second bus part 21 and the type-B second line segment 20 in the direction perpendicular to the plane of the display panel.

With the second bus part 21, the load of the power bus 16 can be reduced to a greater extent by using the second bus part 21, thereby further reducing delay and attenuation of the power signal. In some embodiments, the second bus part 21 and the B-type second line part 20 are arranged in a same layer, thereby simplifying the manufacturing processes of the second bus part 21 and preventing the second bus part 21 from consuming extra layer thickness.

Figure 15:
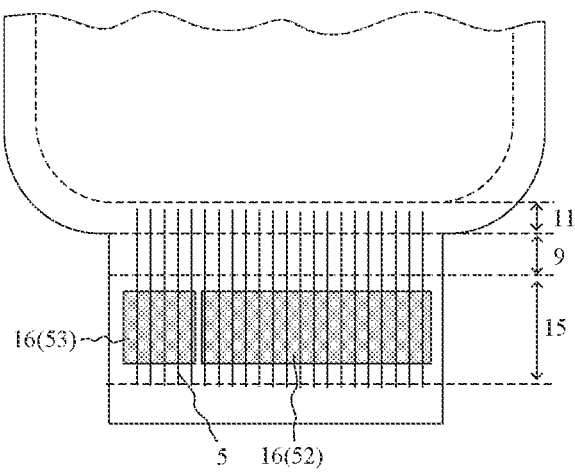
FIG. 15 is a structural diagram of a power bus according to an embodiment of the present disclosure.

As shown in FIG. 15, which is a structural diagram of a power bus 16 according to an embodiment of the present disclosure, the power bus 16 may specifically include a positive power signal bus 52 and/or a negative power signal bus 53. The positive power signal bus 52 is electrically connected to a positive power signal line PVDD in the display area 1, to supply a positive power voltage to the positive power signal line PVDD in the display area 1. The negative power signal bus 53 is electrically connected to a cathode of the light-emitting element, to supply a negative power voltage to the cathode of the light-emitting element.

Figure 16:
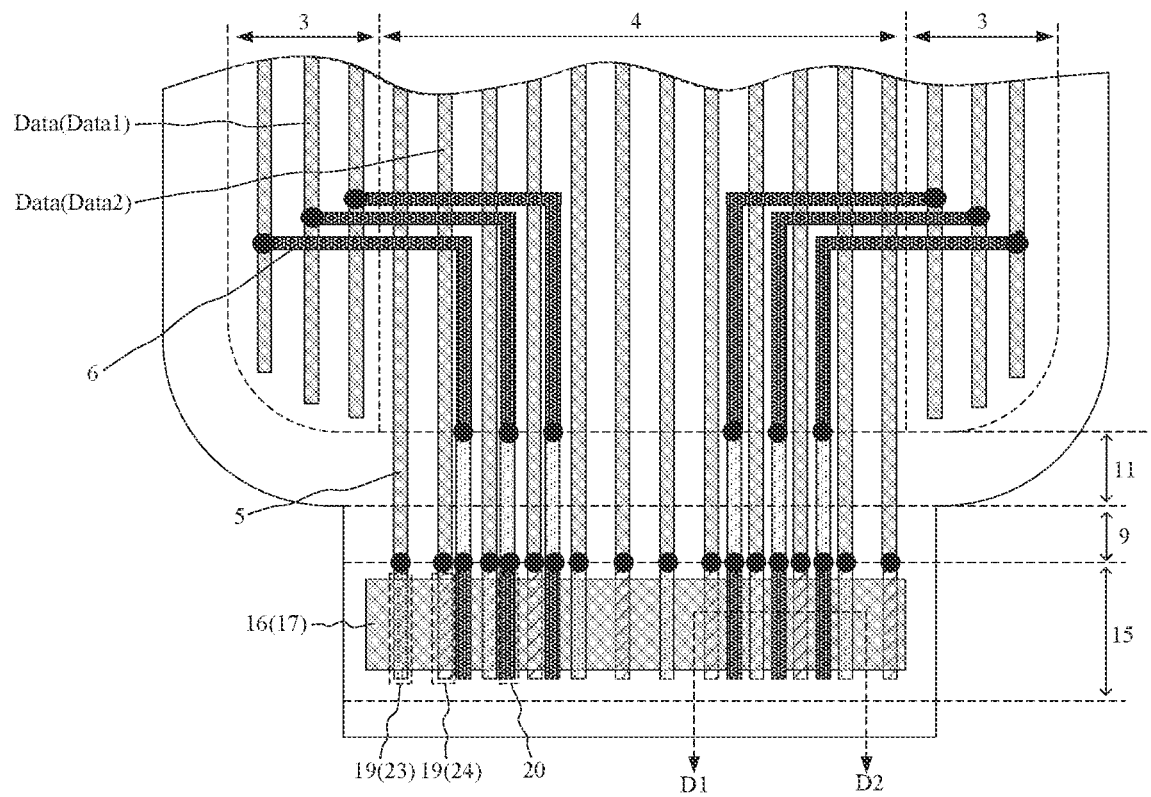
FIG. 16 is a schematic diagram illustrating yet another wiring of a second fan-out area according to an embodiment of the present disclosure.
Figure 17:
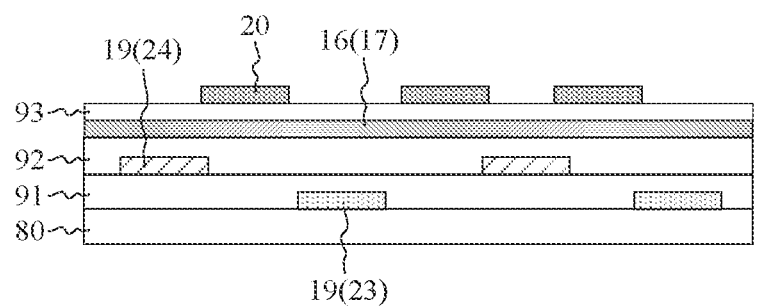
FIG. 17 is a cross-sectional view taken D1-D2 shown in FIG. 16 according to an embodiment of the present disclosure.

FIG. 16 is a schematic diagram illustrating yet another wiring of a second fan-out area 15 according to an embodiment of the present disclosure, and FIG. 17 is a cross-sectional view along D1-D2 shown in FIG. 16. In a possible implementation, as shown in FIG. 16 and FIG. 17, the data line Data further includes an intermediate data line Data2 located in the second display area 4, and the intermediate data line Data2 is electrically connected to the type-A second line segment 19. The type-A second line segments 19 includes a first type-A second line segment 23 and a second type-A second line segment 24 arranged in different layers. The edge data line Data1 is electrically connected to the type-B second line segment 20, and the type-B second line segment 20 is arranged in a same layer as the connection lead 6.

In an example, the first sub-line segment 23 is located in the first metal layer, that is, the first sub-line segment 23 is arranged in a same layer as the first scanning signal line Scan1, the second scanning signal line Scan2 and the light-emitting control signal line Emit; the second sub-line segment 24 is located in the second metal layer, that is, the second sub-line segment 24 is arranged in a same layer as the reset signal line Vref and the first positive power signal line PVDD1; and the type-B second line segment 20 is located in the fourth metal layer. In this case, referring to FIG. 17, a first insulating layer 91 is arranged between the first sub-line segment 23 and the second sub-line segment 24, a second insulating layer 92 is arranged between the second sub-line segment 24 and the first bus part 17, and a third insulating layer 93 is arranged between the first bus part 17 and the type-B second line segment 20.

Compared with the first display area 3, a number of intermediate data lines Data2 in the second display area 4 is larger, and correspondingly, a number of second line segments 18 connected to the intermediate data lines Data2 is larger. By configuring the type-A second line segments 19 connected to the intermediate data lines Data2 as a first type-A second line segment 23 and a second type-A second line segment 24 that are located in different layers, an overall wiring space consumed by the type-A second line segments 19 in the first direction x can be reduced by reducing a spacing between the first type-A second line segment 23 and the second type-A second line segment 24.

As described above, in order to avoid an influence of the connection lead 6 on wiring of other metal wiring in the display area 1, the connection lead 6 can be formed in the fourth metal layer. In this case, when the type-B second line segment 20 electrically connected to the edge data line Data1 is arranged in a same layer as the connection lead 6, it can be formed by directly adjusting and forming a mask pattern corresponding to the fourth metal layer, and the type-B second line segment 20 does not need to consume an additional patterning process or extra layer thickness.

Figure 18:
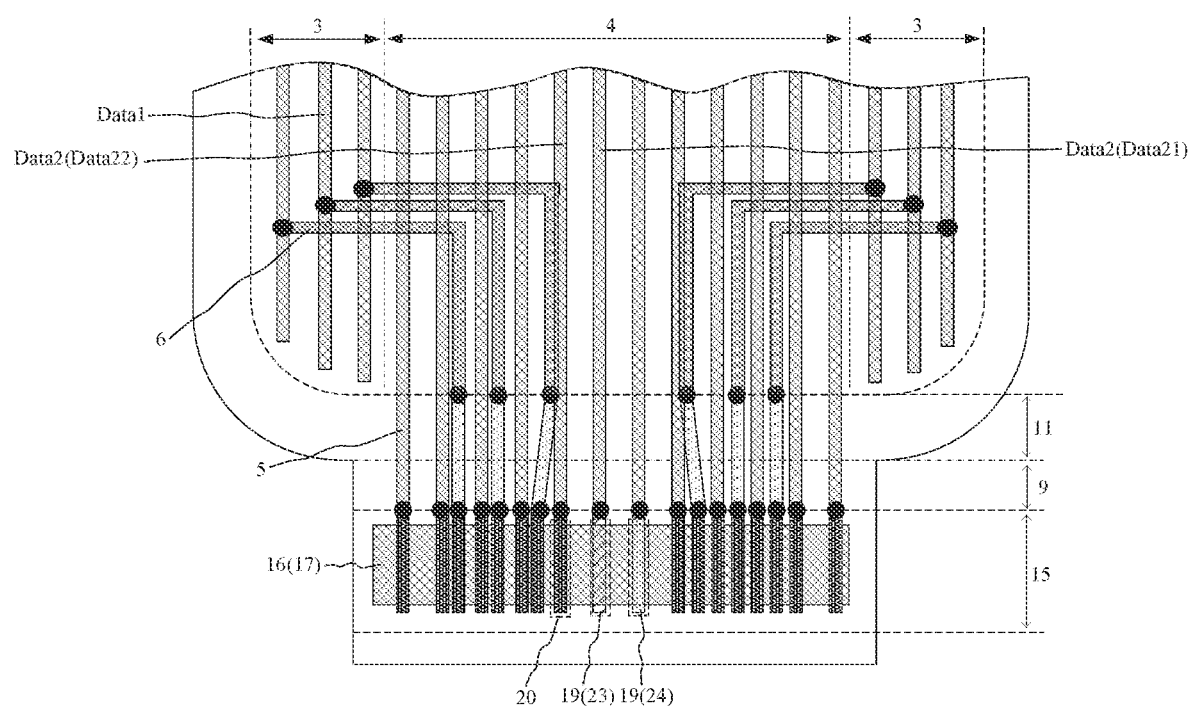
FIG. 18 is a top view of a partial layer structure of a display panel according to an embodiment of the present disclosure.

In a possible implementation, as shown in FIG. 18, which is a top view of a partial layer structure of a display panel according to an embodiment of the present disclosure, electric resistivity of the type-A second line segment 19 is greater than electric resistivity of the type-B second line segment 20. In an example, when the type-A second line segments 19 includes a first type-A second line segment 23 and a second type-A second line segment 24 arranged in different layers, the first type-A second line segment 23 may be located in the first metal layer and the second type-A second line segment 24 may be located in the second metal layer, and the two metal layers can be formed of metal molybdenum with high electric resistivity, thus resulting in a larger electric resistivity of the type-A second line segment 19.

The data line Data further includes the intermediate data line Data2 located in the second display area 4, and the intermediate data line Data2 includes a first intermediate data line Data21. In the direction perpendicular to the plane of the display panel, there is a spacing between the first intermediate data line Data21 and the connection lead 6, that is, there is no overlapping between the first intermediate data line Data21 and the connection lead 6. In this case, the first intermediate data line Data21 is electrically connected to the fan-out line 5 where the type-A second line segment 19 is arranged.

Based on arrangement of the connection lead 6, a length of a whole wiring formed by the edge data line Data1, the connection lead 6 and the fan-out line 5 becomes large, correspondingly, the load becomes large. In this case, attenuation of the data signal transmitted on the edge data line Data1 and attenuation of the data signal transmitted on the first intermediate data line Data21 have a large difference. According to the embodiments of the present disclosure, the fan-out line 5 where the type-A second line segment 19 with a large load is arranged is electrically connected to the first intermediate data line Data21, therefore, a load difference between the first intermediate data line Data21 and the edge data line can be compensated by using a load difference between the fan-out lines 5, so that the attenuation of the data signal transmitted on the first intermediate data line Data21 and the attenuation of the data signal transmitted on the edge data line Data1 tend to be consistent, thus improving uniformity of data voltages written by the pixel circuits 51 at different positions and avoiding display difference.

In a possible embodiment, referring to FIG. 18 again, the electric resistivity of the type-A second line segment 19 is greater than the electric resistivity of the type-B second line segment 20. The data lines Data further include an intermediate data line Data2 located in the second display area 4. The intermediate data line Data2 includes a second intermediate data line Data22. The second intermediate data line Data22 overlaps with the connection lead 6 in the direction perpendicular to the plane of the display panel. The edge data line Data1 and/or the second intermediate data line Data22 are electrically connected to the fan-out line 5 where the type-B second line segment 20 is arranged.

As for the edge data line Data1, the edge data line Data1 is connected to a respective fan-out line 5 through the connection lead 6, therefore, a length of the whole wiring formed by the edge data line Data1, the connection lead 6 and the fan-out line 5 becomes larger, correspondingly, the load becomes large. As for the second intermediate data line Data22, the connection lead 6 overlaps with the second intermediate data line Data22, and parasitic capacitance may be generated between the connection lead 6 and the second intermediate data line Data22. Therefore, the load of the second intermediate data line Data22 may also become larger. In this case, a fan-out line 5 where the type-B second line segment 20 with a small load is arranged is electrically connected to the edge data line Data1 and/or the second intermediate data line Data22, so that a load difference between the edge data line Data1, the second intermediate data line Data22 and the first intermediate data line Data21 can be compensated by using a load difference between a load difference between the fan-out lines 5. Therefore, attenuation of the signal of the data line Data transmitted on the edge data line Data1, attenuation of the signal of the data line Data transmitted on the second intermediate data line Data22 and attenuation of the signal of the data line Data transmitted on the first intermediate data line Data21 can be consistent, thus further improving display uniformity of different positions of the display panel.

Figure 19:
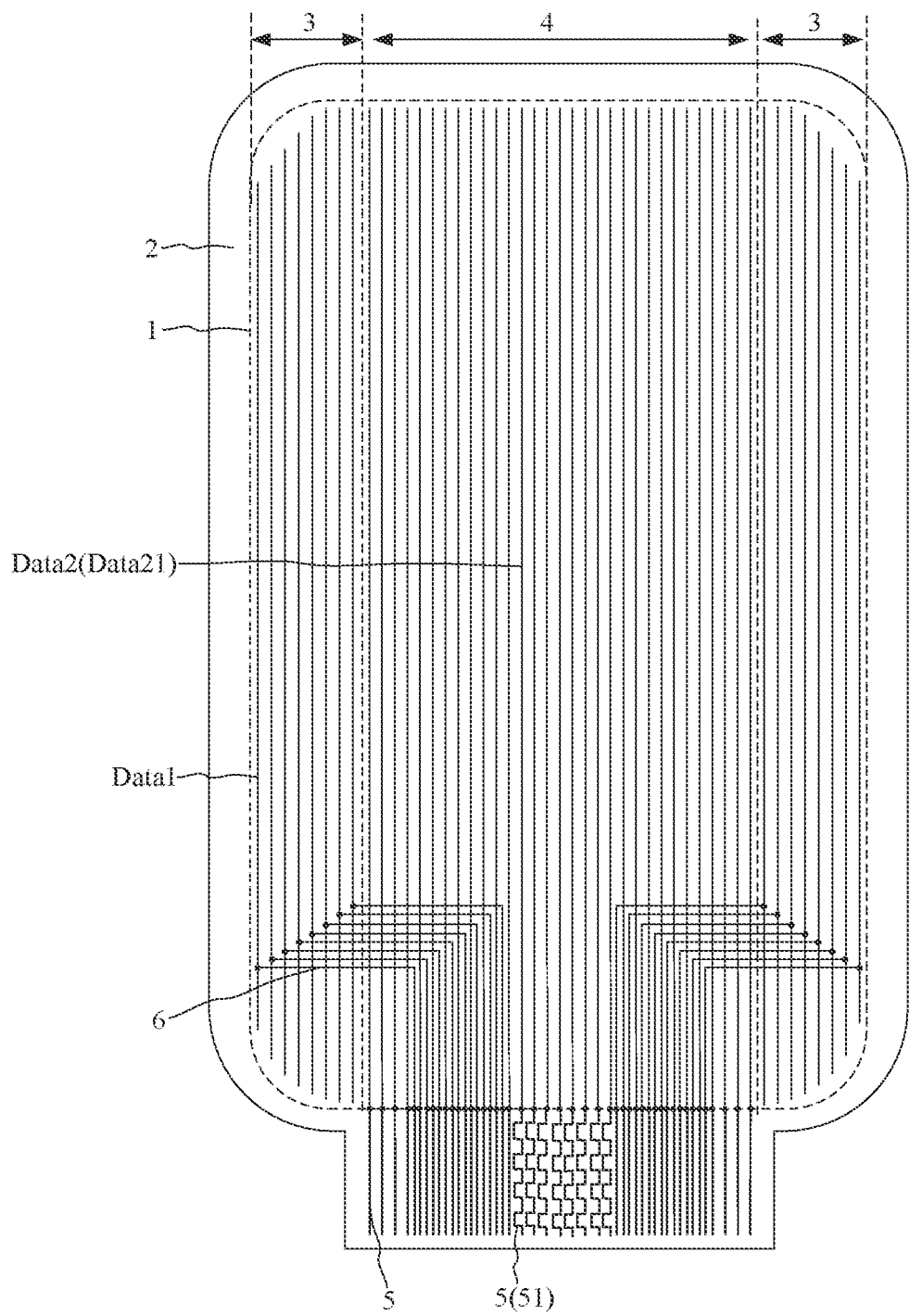
FIG. 19 is another top view of a display panel according to an embodiment of the present disclosure.

FIG. 19 is another top view of a display panel according to an embodiment of the present disclosure. As shown, the data lines Data further include the intermediate data line Data2 located in the second display area 4, and the intermediate data line Data2 includes a first intermediate data line Data21. In the direction perpendicular to the plane of the display panel, there is a spacing between the first intermediate data line Data21 and the connection lead 6, that is, there is no overlapping between the first intermediate data line Data21 and the connection lead 6. The fan-out line 5 includes a first fan-out line 25, the first fan-out line 25 is electrically connected to the first intermediate data line Data21, and at least one of first fan-out lines 25 extends as a non-linear shape. The first fan-out line 25 can extend as a polyline line or as a wave shape.

As described above, a load of the first intermediate data line Data21 is smaller than a load of the second intermediate data line Data22 and the edge data line Data1. The first fan-out line 25 connected to the first intermediate data line Data21 extend as a non-linear shape, a load of the first fan-out line 25 can be increased, then, a load difference between the first intermediate data line Data21 and the second intermediate data line Data22 and the edge data line Data1 can be compensated by using a load difference between the first fan-out line 25 and other fan-out lines 5, so that attenuation of the data signals transmitted on different data lines Data tend to be consistent.

Figure 20:
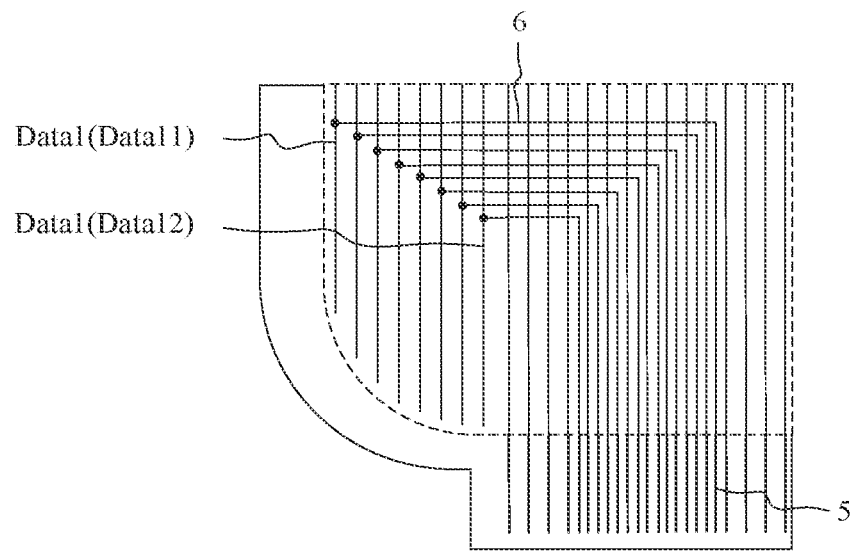
FIG. 20 is another partial top view of a display panel according to an embodiment of the present disclosure.

FIG. 20 is another partial top view of a display panel according to an embodiment of the present disclosure. As shown, the edge data lines Data1 includes a first edge data line Data11 and a second edge data line Data12, and an overlapping area between the first edge data line Data11 and the connection lead 6 is smaller than an overlapping area between the second edge data line Data12 and the connection lead 6 in the direction perpendicular to the plane of the display panel. The overlapping area between the first edge data line Data11 and the connection lead 6 may also be 0.

A length of a connection lead 6 electrically connected to the first edge data line Data11 is larger than a length of a connection lead 6 electrically connected to the second edge data line Data12. Therefore, load difference caused by different overlapping areas between different edge data lines Data1 and connection leads 6 can be compensated by using load difference caused by different lengths of connection leads 6 connected to different edge data lines Data1, thereby improving uniformity of attenuation of data signals transmitted on different edge data lines Data1.

Figure 21:
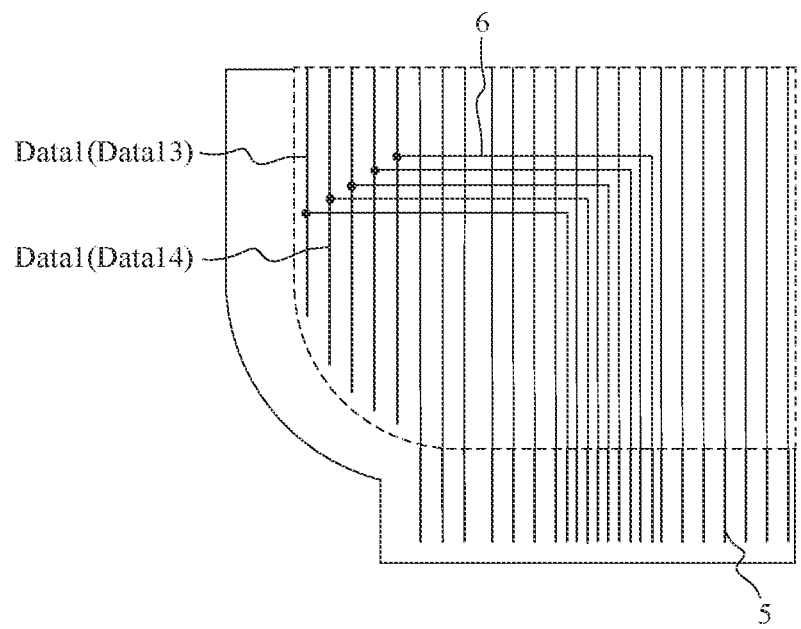
FIG. 21 is another top view of a display panel according to an embodiment of the present disclosure.

In a possible implementation, as shown in FIG. 21, which is another top view of a display panel according to an embodiment of the present disclosure, the edge data lines Data1 include a third edge data line Data13 and a fourth edge data line Data14. The third edge data line Data13 is located at a side of the fourth edge data line Data14 away from the second display area 4, and a length of the third edge data line Data13 is smaller than a length of the fourth edge data line Data14. A length of a connection lead 6 electrically connected to the third edge data line Data13 is larger than a length of a connection lead 6 electrically connected to the fourth edge data line Data14. Therefore, a length difference between different edge data lines Data1 can be compensated by using length difference between connection leads 6 connected to different edge data lines Data1, so that the loads of different edge data lines Data1 tend to be consistent.

Figure 22:
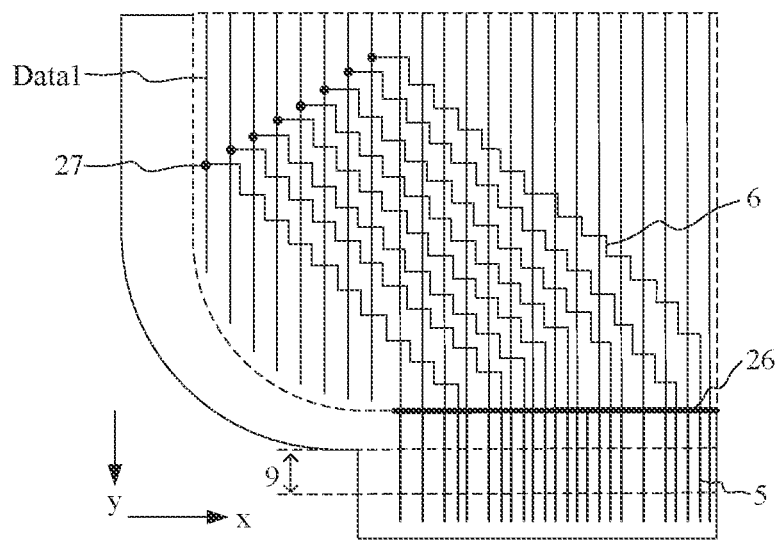
FIG. 22 is another structural schematic diagram of a connection lead according to an embodiment of the present disclosure.

FIG. 22 is another structural schematic diagram of a connection lead 6 according to an embodiment of the present disclosure. In the illustrated embodiment, at least one of the connection leads 6 extends as a serpentine shape.

When the connection lead 6 extends as a serpentine shape, an extension length of the connection lead 6 can be more flexibly regulated under a condition of a fixed longitudinal extension space of the connection lead 6 in the second direction Y, so that a load difference between different edge data lines Data1 can be further compensated by using a length difference between different connection leads 6.

In a possible embodiment, referring to FIG. 22 again, the non-display area 2 includes a bending area 9, and the display area 1 includes a first display edge 26 adjacent to the bending area 9, that is, the first display edge 26 is a lower edge of the display area 1.

There is a connection through-hole 27 between the connection lead 6 and the edge data line Data1. In the direction perpendicular to the plane of the display panel, at least two connection through-holes 27 have different shortest distances from an extension line of the first display edge 26, that is, at least two connection through-holes 27 are arranged in a non-aligned manner in the first direction x. In this case, a longitudinal extension length of the connection lead 6 in the second direction y can be further regulated by using arrangement positions of the connection through-holes 27. For example, when the shortest distance between a connection through-hole 27 and the extension line of the first display edge 26 is large, the connection lead 6 has a large longitudinal extension distance in the second direction y; and when the connection lead 6 extends as a serpentine shape, the extension length of the connection lead 6 can be regulated to a greater extent.

Figure 23:
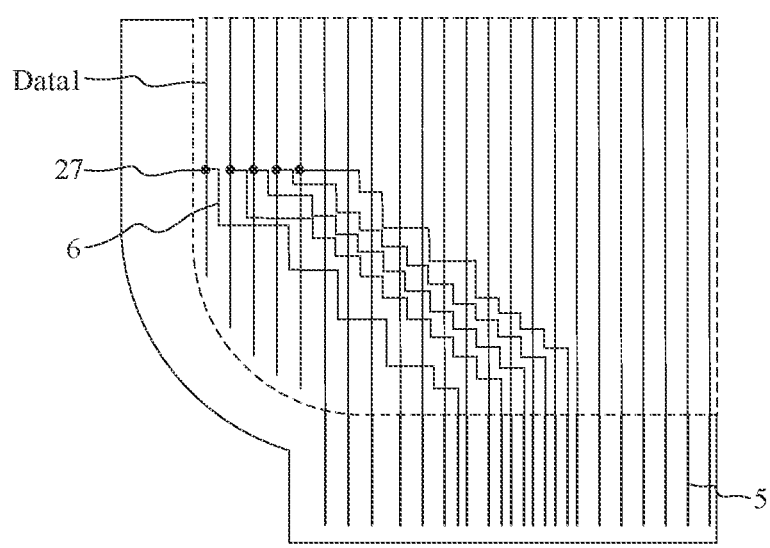
FIG. 23 is another structural schematic diagram of a connection lead according to an embodiment of the present disclosure.

FIG. 23 is another structural schematic diagram of a connection lead 6 according to an embodiment of the present disclosure. As shown, the connection through-holes 27 may have a same shortest distance from the first display edge 26. In this case, the connection through-holes 27 are aligned in the first direction x.

Figure 24:
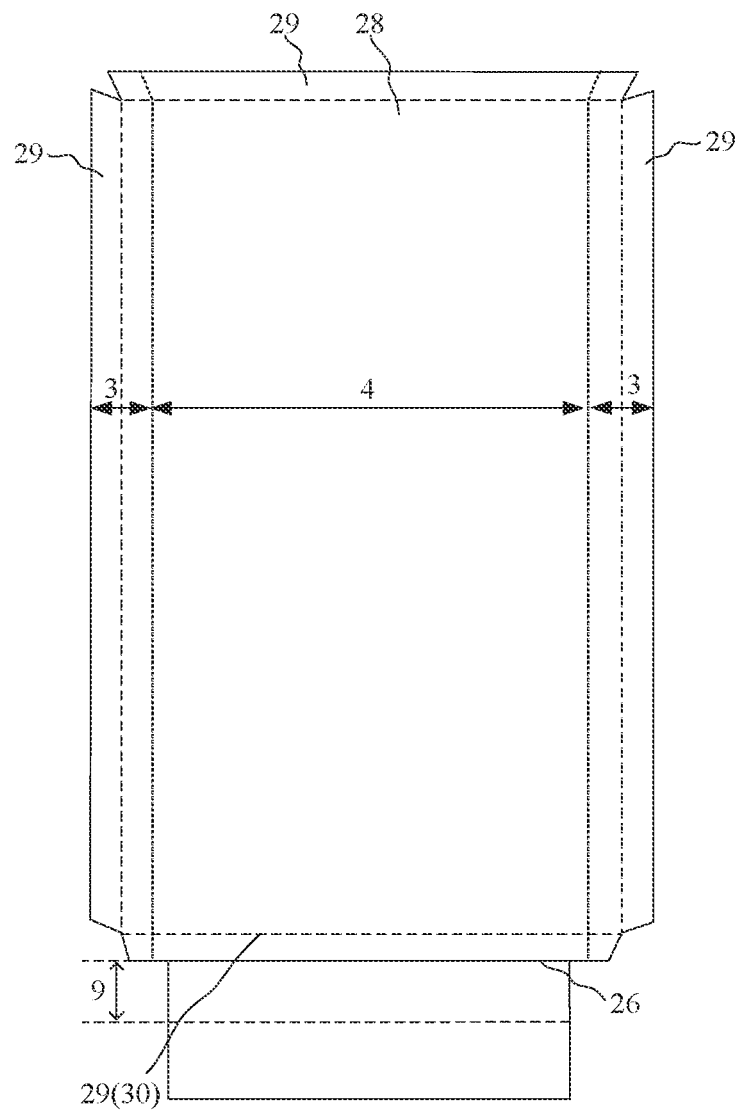
FIG. 24 is yet another top view of the display panel according to an embodiment of the present disclosure.

It should be noted that technical schemes according to the embodiments of the present disclosure can also be applied to curved display panels such as dual-edge curved display panels or quad-edge curved display panels. As shown in FIG. 24, which is yet another top view of the display panel according to an embodiment of the present disclosure, the display panel has a flat display area 28 and a curved display area 29, and the curved display area 29 includes a first curved display area 30 adjacent to the bending area 9, and the first display edge 26 can be an edge of the first curved display area 30.

Figure 25:
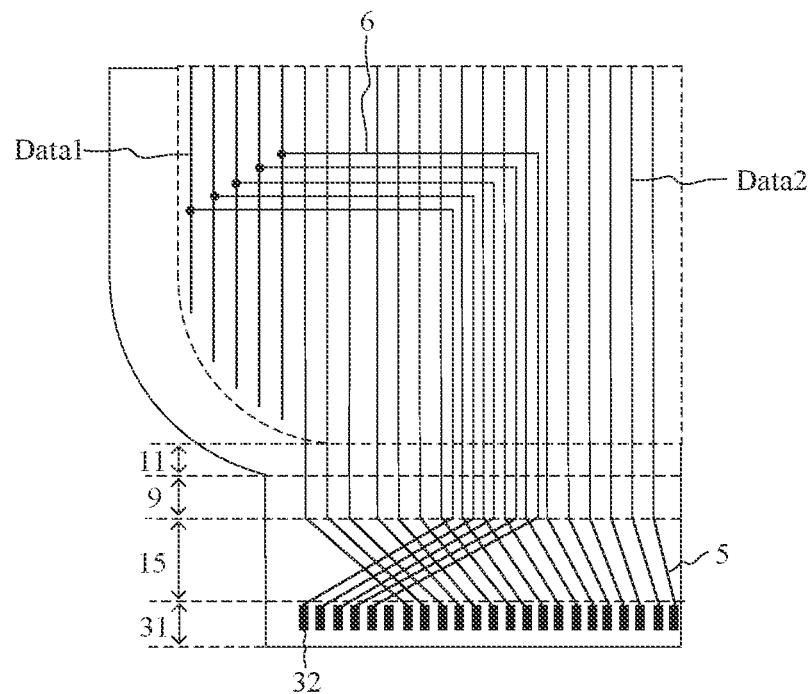
FIG. 25 is yet another partial top view of a display panel according to an embodiment of the present disclosure.

FIG. 25 is yet another partial top view of a display panel according to an embodiment of the present disclosure. As shown, the non-display area 2 includes a binding area 31 located at a side of the second fan-out area 15 away from the bending area 9, and pins 32 are provided in the binding area 31. The pins 32 are configured to provide data voltages to the data line Data. Generally, an arrangement of the pins 32 is consistent with an arrangement of the data lines Data.

When the connection lead 6 extends in the second display area 4 and when the fan-out line 5 is led out in the first fan-out area 11, an arrangement of the fan-out lines 5 will be disturbed, as a result, the arrangement of the fan-out lines 5 is inconsistent with the arrangement of the data lines Data. In this case, if positions of the pins 32 are intended not to be changed, when the fan-out line 5 further extends to the second fan-out area 15, the fan-out lines 5 connected to the connection leads 6 can be configured to extend obliquely in the second fan-out area 15, and the ends of the fan-out lines 5 connected to the connection leads 6 can be led to a side of the ends of the fan-out lines 5 connected to the intermediate data lines Data2. As described above, the fan-out lines 5 connected to the edge data lines Data1 in the second fan-out area 15 can be arranged in a same layer as the connection leads 6, and both are located in the fourth metal layer, therefore, when these fan-out lines 5 extend obliquely in the second fan-out area 15, they will not be short-circuited with other fan-out lines 5.

In another possible embodiment, as shown in FIG. 26, which is yet another partial top view of a display panel according to an embodiment of the present disclosure, second ends 8 of the connection leads 6 are all located in the first display area 3. In addition, the first display area 3 is provided with $1^{st}$ to $n^{th}$ edge data lines Data1 arranged along the first direction x, and the second ends 8 of the n connection leads 6 electrically connected to the n edge data lines Data1 are arranged along the first direction x. A connection lead 6 which includes an $i^{th}$ second end 8 is electrically connected to an $i^{th}$ edge data line Data1.

Figure 27:
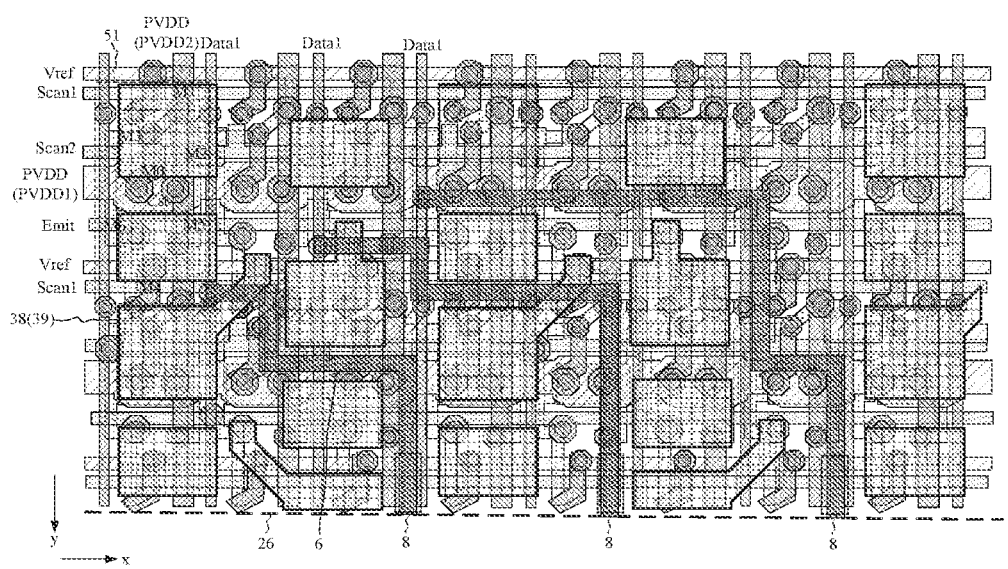
FIG. 27 is a schematic view of another layer structure of a display panel according to an embodiment of the present disclosure.

With reference to FIG. 22, the second end 8 of the connection lead 6 refers to an end of the connection lead 6 adjacent to the first display edge 26 (lower edge) in the display area 1. FIG. 27 is a schematic view of another layer structure of a display panel according to an embodiment of the present disclosure. As shown in FIG. 27, in the layer structure of the display panel, a sub-pixel includes a pixel circuit 51 and a light-emitting element 38. The light-emitting element 38 includes an anode 39, and along the first direction X, the second end 8 of the connection lead 6 at least partially overlaps with the anode 39 at a side adjacent to the first display edge 26.

Since an arrangement of the second ends 8 of multiple connection leads 6 is kept the same as an arrangement of multiple edge Data lines Data1, when the fan-out lines 5 are led out in the first fan-out area 11, the arrangement of the fan-out lines 5 is directly the same as the arrangement of the data lines Data. In this case, the part of the fan-out lines 5 connected to the edge data lines Data1 does not need to extend obliquely in the second fan-out area 15, and thus, there's a more flexible selection range in determining which metal layer this part of the line segments shall be located in. For example, this part of the line segments does not need to be restricted in the fourth metal layer, but can be flexibly selected to be located in the first metal layer, the second metal layer, the third metal layer or the fourth metal layer. Moreover, with this configuration, multiple pins 32 in the binding area 31 can still have a same arrangement as the data lines Data without needing to change the arrangement of the pins 32, thereby reducing manufacturing cost of the display panel.

Figure 28:
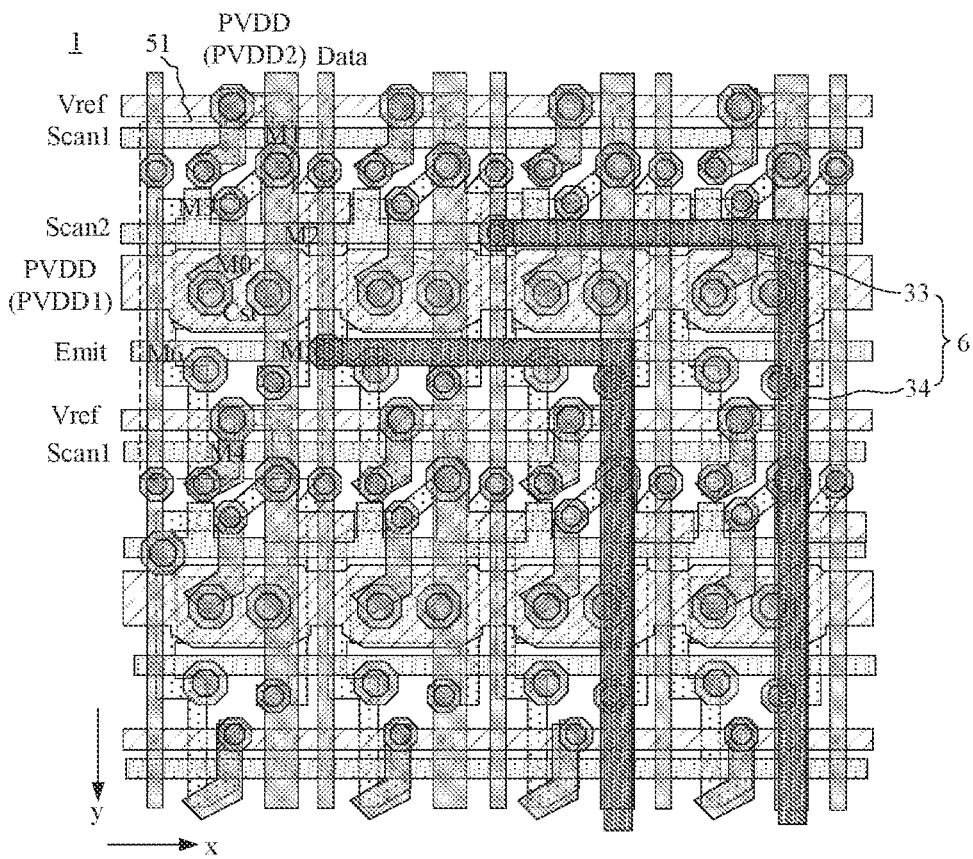
FIG. 28 is a top view of yet another layer structure of a display panel according to an embodiment of the present disclosure.
Figure 29:
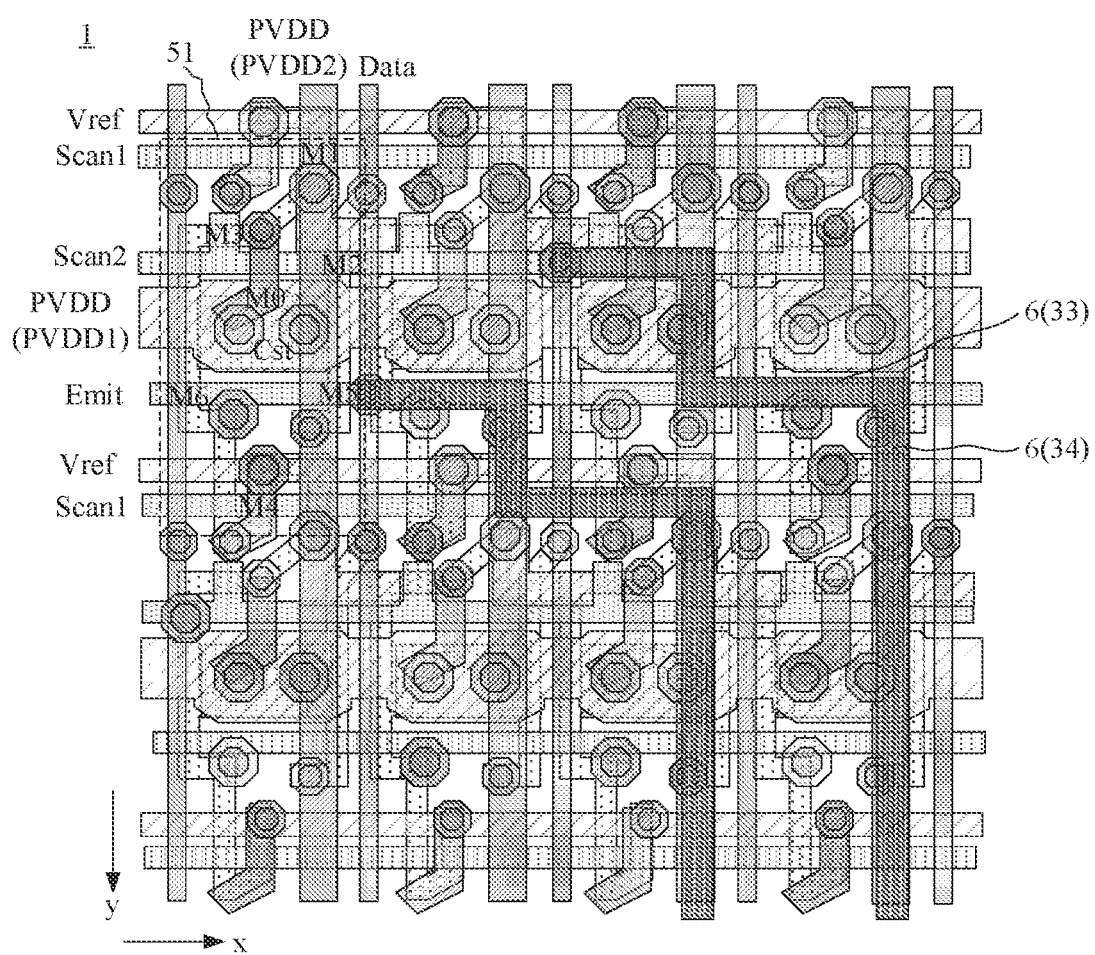
FIG. 29 is a top view of still another layer structure of a display panel according to an embodiment of the present disclosure.

FIG. 28 is a top view of yet another layer structure of a display panel according to an embodiment of the present disclosure, and FIG. 29 is a top view of still another layer structure of a display panel according to an embodiment of the present disclosure. In some embodiments, as shown in FIG. 28 and FIG. 29, the display panel includes a first positive power signal line PVDD1, a second positive power signal line PVDD2, a scanning signal line (such as a first scanning signal line Scan1 and a second scanning signal line Scan2), a reset signal line Vref and a light-emitting control signal line Emit that are located in the display area 1. Each of the second positive power signal line PVDD2 and the data line Data extends along the second direction y. Each of the first positive power signal line PVDD1, the scanning signal line, the reset signal line Vref and the light-emitting control signal line Emit extends along the first direction x. The first direction x intersects with the second direction Y.

The connection lead 6 includes a first lead segment 33 extending in the first direction x and a second lead segment 34 extending in the second direction y. In the direction perpendicular to the plane of the display panel, the first lead segment 33 overlaps with at least one of the first positive power signal line PVDD1, the scanning signal line, the reset signal line Vref and the light-emitting control signal line Emit, and/or at least part of the second lead segment 34 overlaps with at least one of the second positive power signal line PVDD2 and the data line Data.

When the first lead segment 33 and the second lead segment 34 overlap with original signal lines in the display panel and when external ambient light is incident to the connection lead 6, the connection lead 6 has no additional influence on reflection of ambient light, and thus it has no influence on reflection uniformity of the display panel, thereby optimizing the displaying effect.

Figure 30:
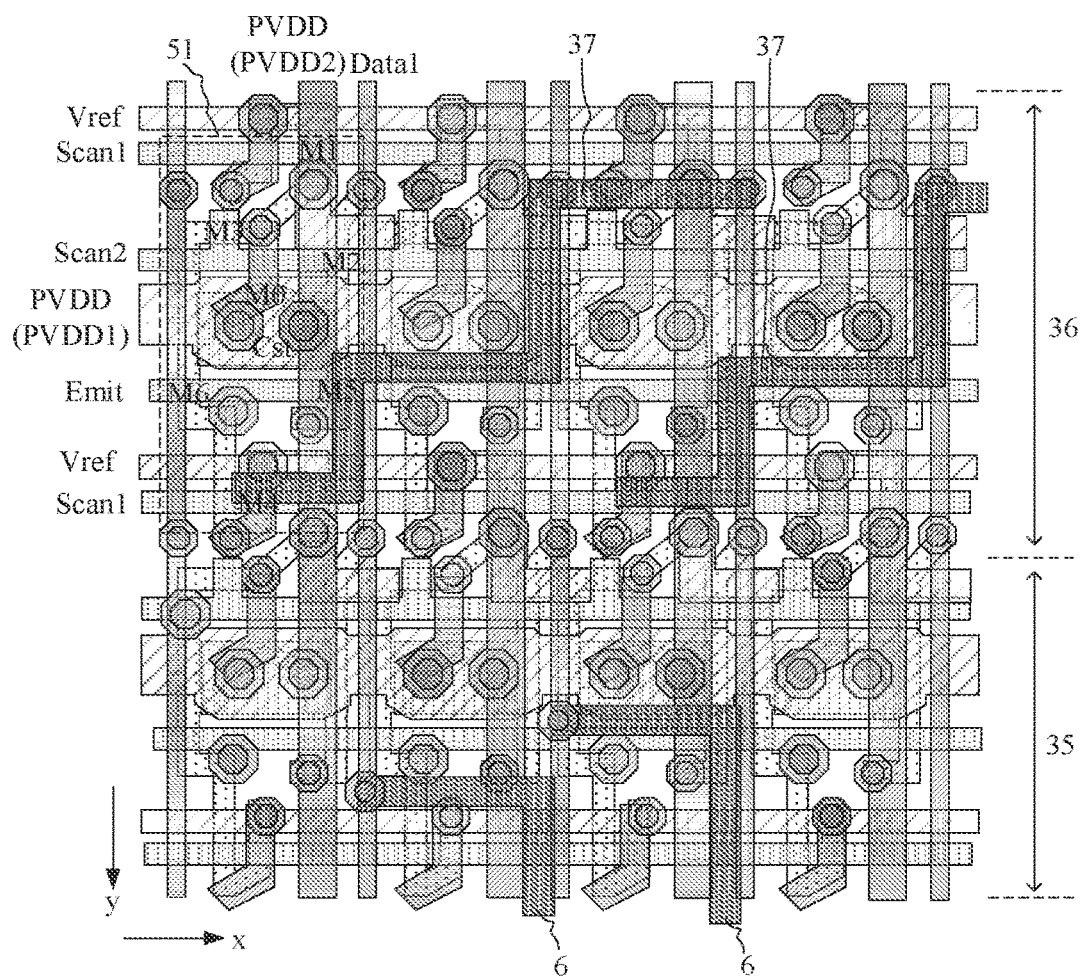
FIG. 30 is a top view of still another layer structure of a display panel according to an embodiment of the present disclosure.

FIG. 30 is a top view of still another layer structure of a display panel according to an embodiment of the present disclosure. As shown, the display area 1 includes a first area 35 and a second area 36, and the connection lead 6 is located in the first area 35. In some embodiments, the display panel includes a dummy wire 37. The dummy wire 37 is located in the second area 36 and arranged in a same layer as the connection lead 6, and the dummy wire 37 is floating or receives a fixed voltage.

When the connection lead 6 is provided, since the connection lead 6 is more adjacent to a light-emitting side of the display panel, reflection of the connection lead 6 to external ambient light is different from that of other metal wiring. In the embodiments of the present disclosure, the dummy wire 37 is arranged at the same layer as the connection lead 6 provided in the second area 36 where no connection lead 6 is arranged, so that reflection uniformity of the first area 35 and the second area 36 to external ambient light can be improved by using the dummy wire 37.

In some embodiments, the fixed voltage can be a power supply voltage. In this case, the dummy wire 37 can also be electrically connected to the power signal line, for example, the dummy wire 37 is electrically connected to the positive power signal line PVDD, thereby reducing the load of the positive power signal line PVDD and further reducing voltage drop of the positive power supply signal.

Figure 31:
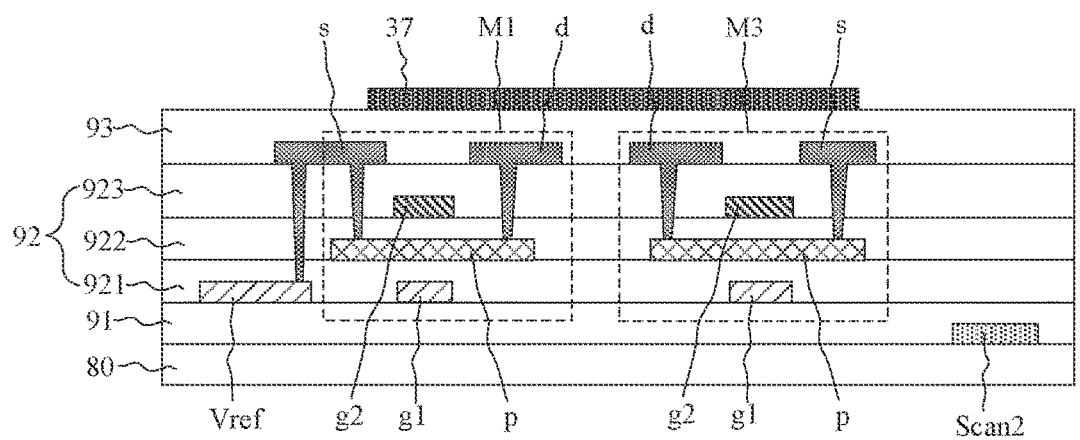
FIG. 31 is a schematic view of yet another layer structure of a display panel according to an embodiment of the present disclosure.

In addition, as described above, with reference to FIG. 7, the gate reset transistor M1 and the threshold compensation transistor M3 in the pixel circuit 51 may be IGZO transistors. In this case, the gate reset transistor M1 and the threshold compensation transistor M3 may have a top-bottom double-gate structure. As shown in FIG. 31, which is a schematic view of yet another layer structure of a display panel according to an embodiment of the present disclosure, the gate reset transistor M1 and the threshold compensation transistor M3 each include a first gate g1, an indium gallium zinc oxide active layer P arranged at a side of the first gate g1 facing away from the substrate 80, a second gate g2 arranged at a side of the indium gallium zinc oxide active layer P facing away from the substrate 80, and a first electrode S and a second electrode D that are arranged at a side of the second gate g2 facing away from the substrate 80. The first gate g1 is located in the second metal layer, that is, the first gate g1 is in a same layer as the reset signal line Vref, the first electrode s and the second electrode d are located in the third metal layer, that is, the first electrode s and the second electrode d are in a same layer as the data line Data, and the second gate g2 is located in a fifth metal layer between the second layer and the third metal layer.

In this case, the second insulating layer 92 may include a first sub-insulating layer 921 between the first gate g1 and the indium gallium zinc oxide active layer P, a second sub-insulating layer 922 between the indium gallium zinc oxide active layer P and the second gate g2, and a third sub-insulating layer 923 between the second gate g2 and the first electrode s.

Compared with the first metal layer and the second metal layer, the fifth metal layer where the second gate g2 is located is more adjacent to the third metal layer, so the signal transmitted on the data line Data has a greater influence on the second gate g2. Therefore, in the embodiments of the present disclosure, when the dummy wire 37 receives a fixed voltage, the dummy wire 37 can be disposed to overlap with the second gate g2 of the gate reset transistor M1 and/or the threshold compensation transistor M3 in a direction perpendicular to the plane of the substrate 80, thereby shielding interference of the data line Data on the second gate g2 in such transistors and thus improving reliability of the circuit operation.

Generally, in the display panel, the second gate g2 is electrically connected to a second gate signal line (not shown in the figure) extending along the first direction x or the second direction y, and the dummy wire 37 may at least partially overlap with the second gate signal line in the direction perpendicular to the plane of the substrate 80.

Figure 32:
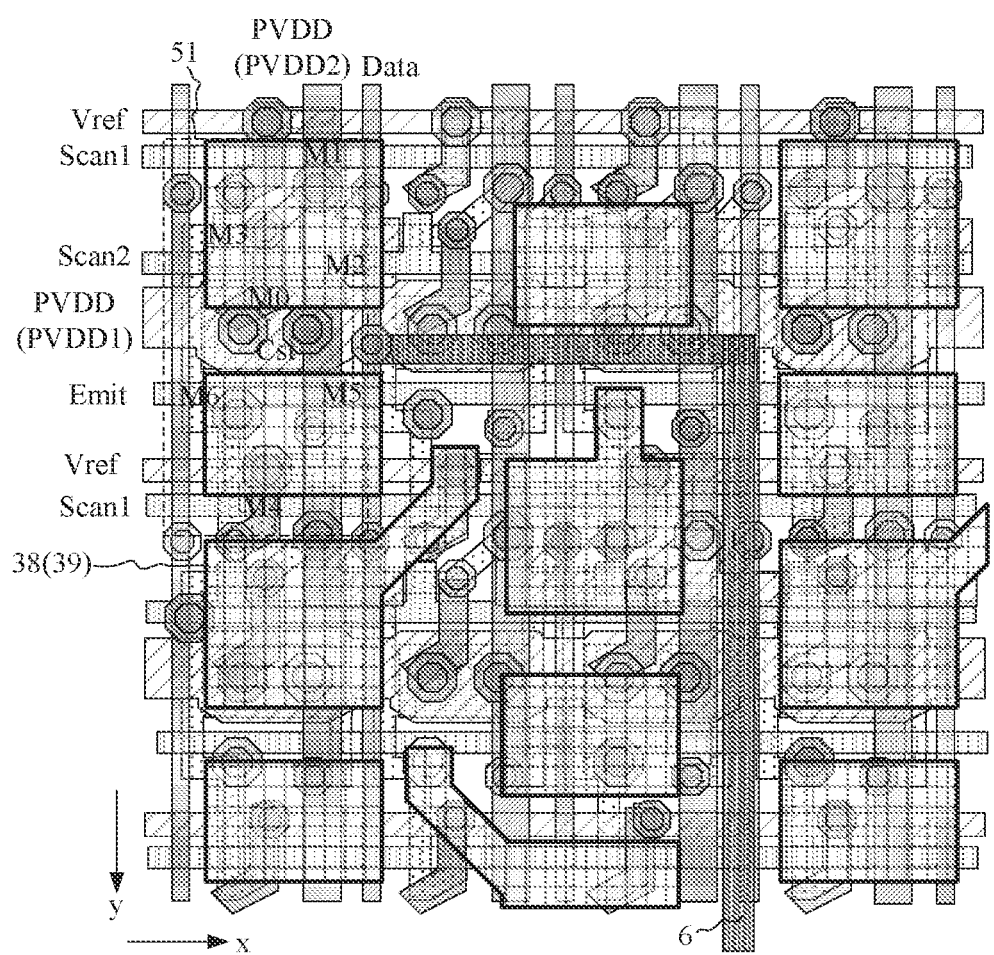
FIG. 32 is a top view of still another layer structure of a display panel according to an embodiment of the present disclosure.
Figure 33:
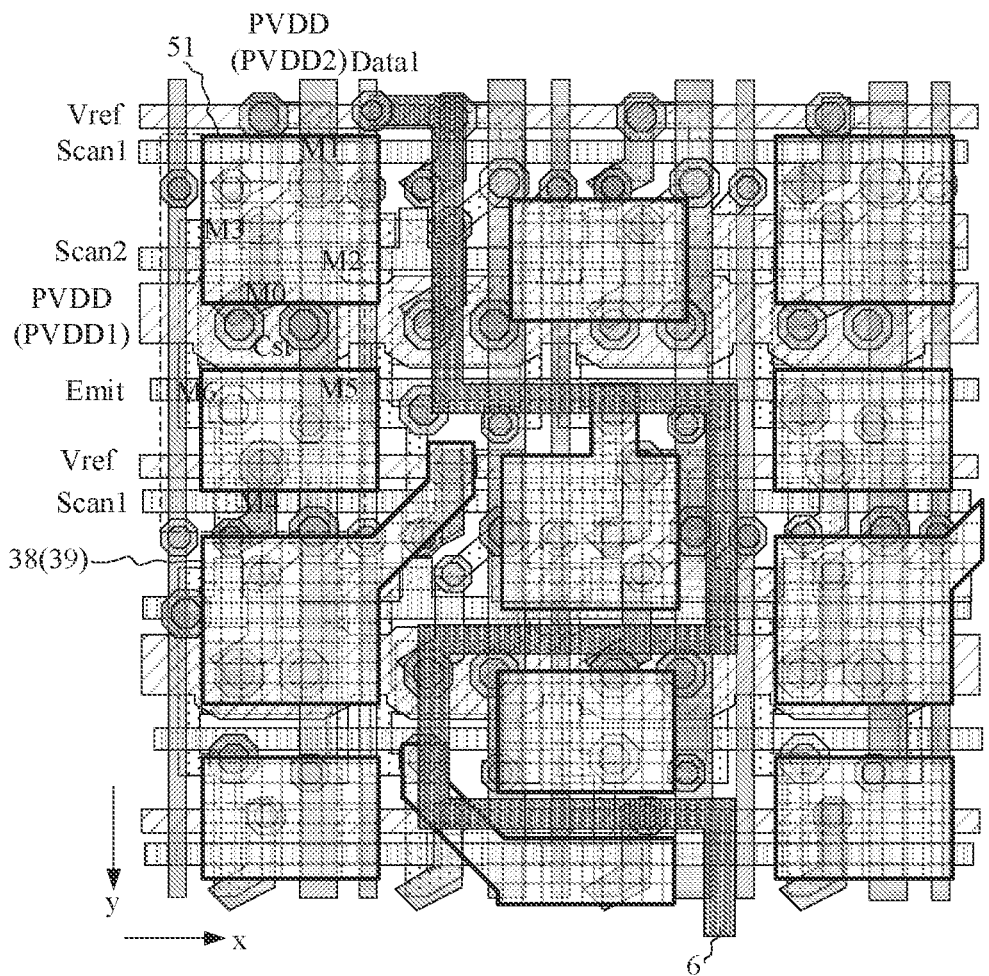
FIG. 33 is a top view of still another layer structure of a display panel according to an embodiment of the present disclosure.
Figure 34:
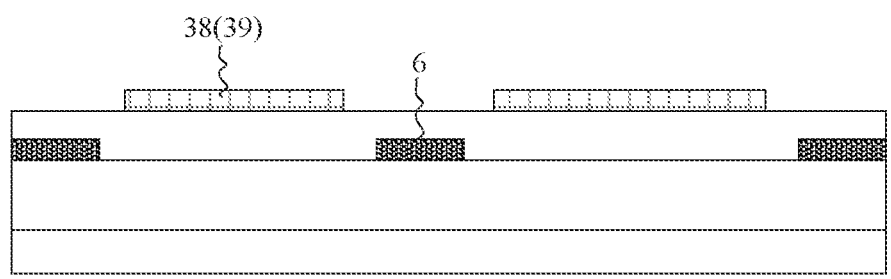
FIG. 34 is a schematic view of an arranging position of a connection lead of a display panel according to an embodiment of the present disclosure.

FIG. 32 is a top view of still another layer structure of a display panel according to an embodiment of the present disclosure, FIG. 33 is a top view of still another layer structure of a display panel according to an embodiment of the present disclosure, and FIG. 34 is a schematic view of an arranging position of a connection lead 6 of a display panel according to an embodiment of the present disclosure. In a possible implementation, as shown in FIG. 32 to FIG. 34, the display panel includes a light-emitting element 38 located in the display area 1, and the light-emitting element 38 includes an anode 39. There is a spacing between the connection lead 6 and the anode 39 in the direction perpendicular to the plane of the display panel.

If the connection lead 6 overlaps with the anode 39, the connection lead 6 may cause the anode 39 to partially protrude, as a result, the anode 39 to be not flat, thus affecting light-emitting effect of the light-emitting element 38 and causing undesirable phenomena for the display panel such as color deviation at a viewing angle. According to the embodiments of the present disclosure, the connection lead 6 does not overlap with the anode 39, so that the connection lead 6 has no influence on flatness of the layer of the anode 39, thereby avoiding color deviation at a viewing angle.

Figure 35:
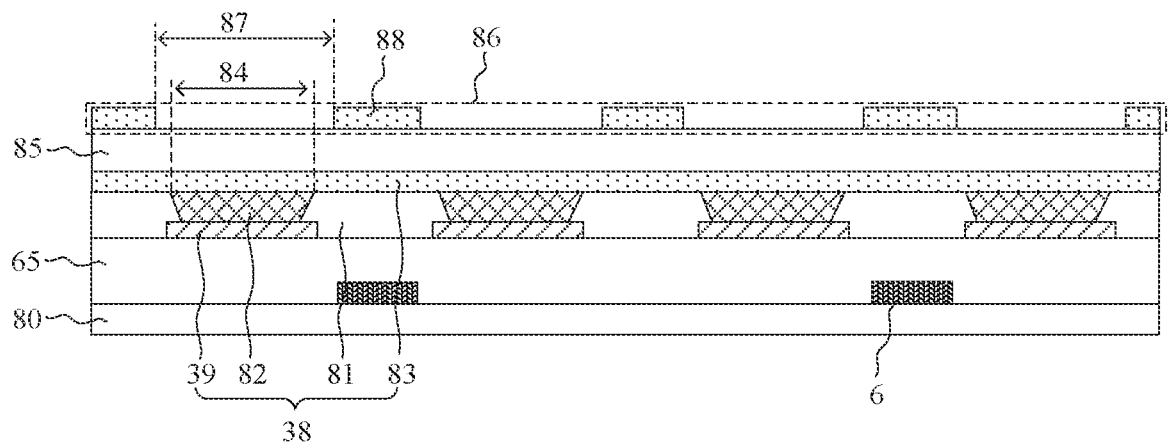
FIG. 35 is a schematic view of yet another layer structure of a display panel according to an embodiment of the present disclosure.

In some embodiments, as shown in FIG. 35, which is a schematic view of yet another layer structure of a display panel according to an embodiment of the present disclosure, the light-emitting element 38 includes a pixel definition layer 81, a light-emitting layer 82 and a cathode 83. The pixel definition layer 81 is located at a side of the anode 39 facing away from the substrate 80. The pixel definition layer 81 includes an opening 84. The light-emitting layer 82 is located in the opening 84. The cathode 83 is located at a side of the pixel definition layer 81 and the light-emitting layer 82 facing away from the substrate 80. The opening 84 formed in the pixel definition layer 81 is an aperture area of the sub-pixel, which corresponds to a light-emitting area of the sub-pixel. In addition, a protective layer 85 is provided at a side of the cathode 83 facing away from the substrate 80.

Figure 36:
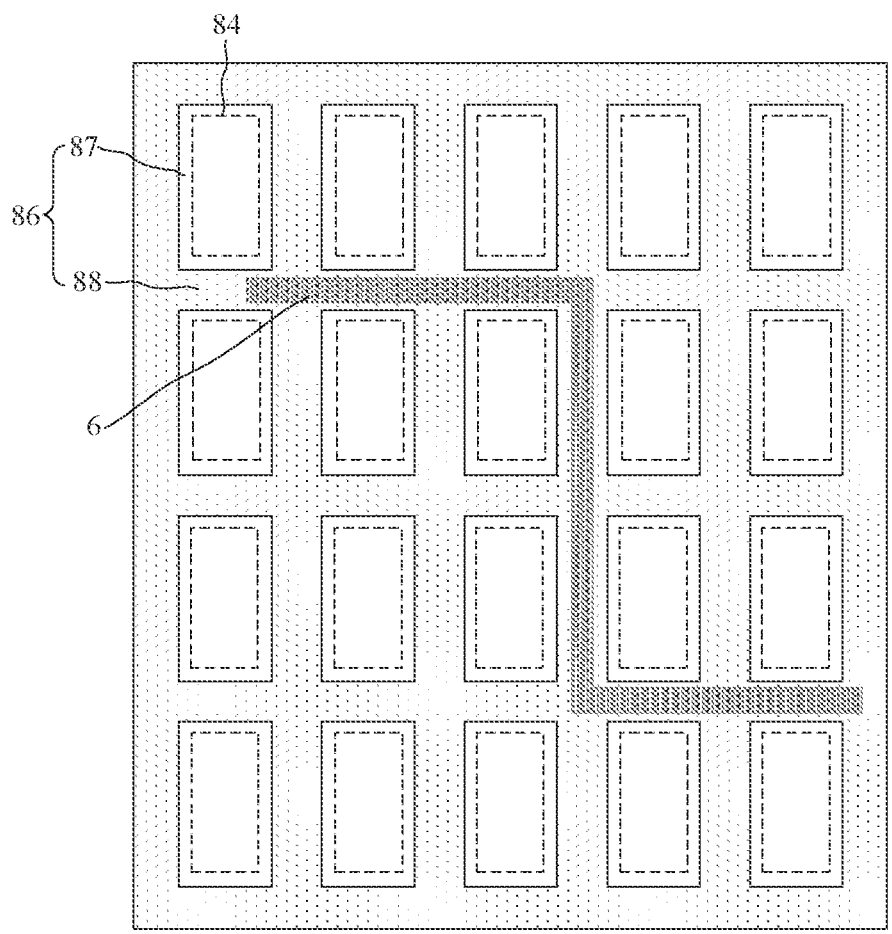
FIG. 36 is a top view of a touch electrode according to an embodiment of the present disclosure.

In some embodiments, with reference to FIG. 35, as shown in FIG. 36, which is a top view of a touch electrode according to an embodiment of the present disclosure, the display panel includes a touch electrode 86. The touch electrode 86 is located at a side of the protective layer 85 facing away from the substrate 80, and is configured to sense signal change caused by a finger touching the display screen, so as to detect a touch position of the finger. The touch electrode 86 has a mesh structure, and includes an electrode strip 88 and a mesh hole 87, and the mesh hole 87 expose the opening 84 formed in the pixel definition layer 81.

In the embodiments of the present disclosure, when the connection lead 6 does not overlap with the anode 39, the electrode strip 88 in the touch electrode 86 can overlap with the connection lead 6 in the direction perpendicular to the plane of the display panel, so as to avoid an additional influence of the connection lead 6 on reflection of the ambient light and avoid excessive difference of reflectivity in different areas.

In addition, referring to FIG. 35, in some embodiments, the display panel includes a planarization layer 65 located between the connection lead 6 and the light-emitting element 38.

Figure 37:
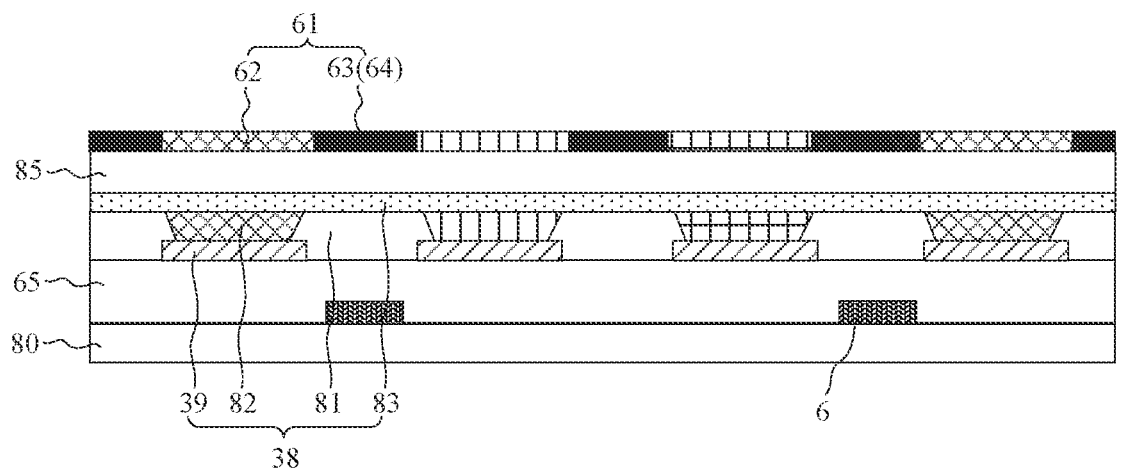
FIG. 37 is a schematic view of yet another layer structure of a display panel according to an embodiment of the present disclosure.
Figure 38:
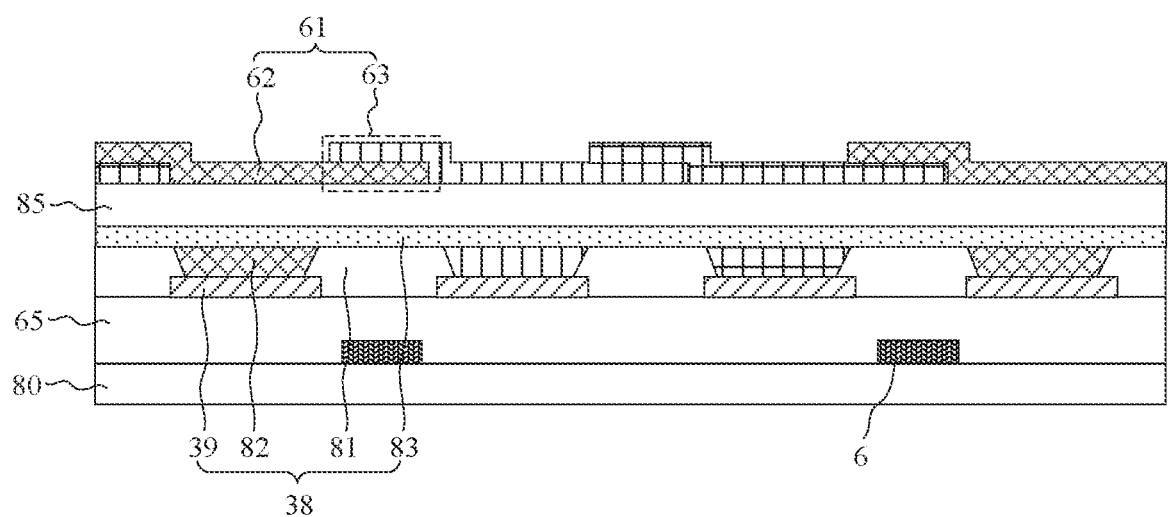
FIG. 38 is a schematic view of yet another layer structure of a display panel according to an embodiment of the present disclosure.

FIG. 37 is a schematic view of yet another layer structure of a display panel according to an embodiment of the present disclosure, and FIG. 38 is a schematic view of yet another layer structure of a display panel according to an embodiment of the present disclosure. In some embodiments, as shown in FIG. 37 and FIG. 38, the display panel includes a light filter layer 61 located at a side of the protective layer 85 facing away from the substrate 80, and the light filter layer 61 includes a plurality of color films 62, which are configured to filter external ambient light having colors different from the respective colors of the plurality of color films 62, so as to reduce external ambient light incident onto the display panel, and further reduce a risk of external ambient light being reflected to human eyes by metal wiring in the display panel. The color of the color film 62 is the same as a color of light emitted by a respective light-emitting element 38, to ensure that the light emitted by the light-emitting element 38 can normally exit from the display panel through the color film 62.

In some embodiments, the light filter layer 61 includes a light shielding structure 63. The light shielding structure is configured to prevent mutual interference of light emitted from adjacent light-emitting elements 38 and improve the display effect. Referring to FIG. 37, the light shielding structure 63 may be a black matrix 64. In some embodiments, referring to FIG. 38, the light shielding structure 63 can be formed by overlapping two adjacent color films 62, in this way, a forming process of the black matrix 64 can be saved and the producing process can be saved.

In the embodiments of the present disclosure, the connection lead 6 overlaps with the light shielding structure 63 in the direction perpendicular to the plane of the display panel, so as to avoid an influence of the connection lead 6 on reflection of ambient light and avoid excessive difference of reflectivity in different areas.

Figure 39:
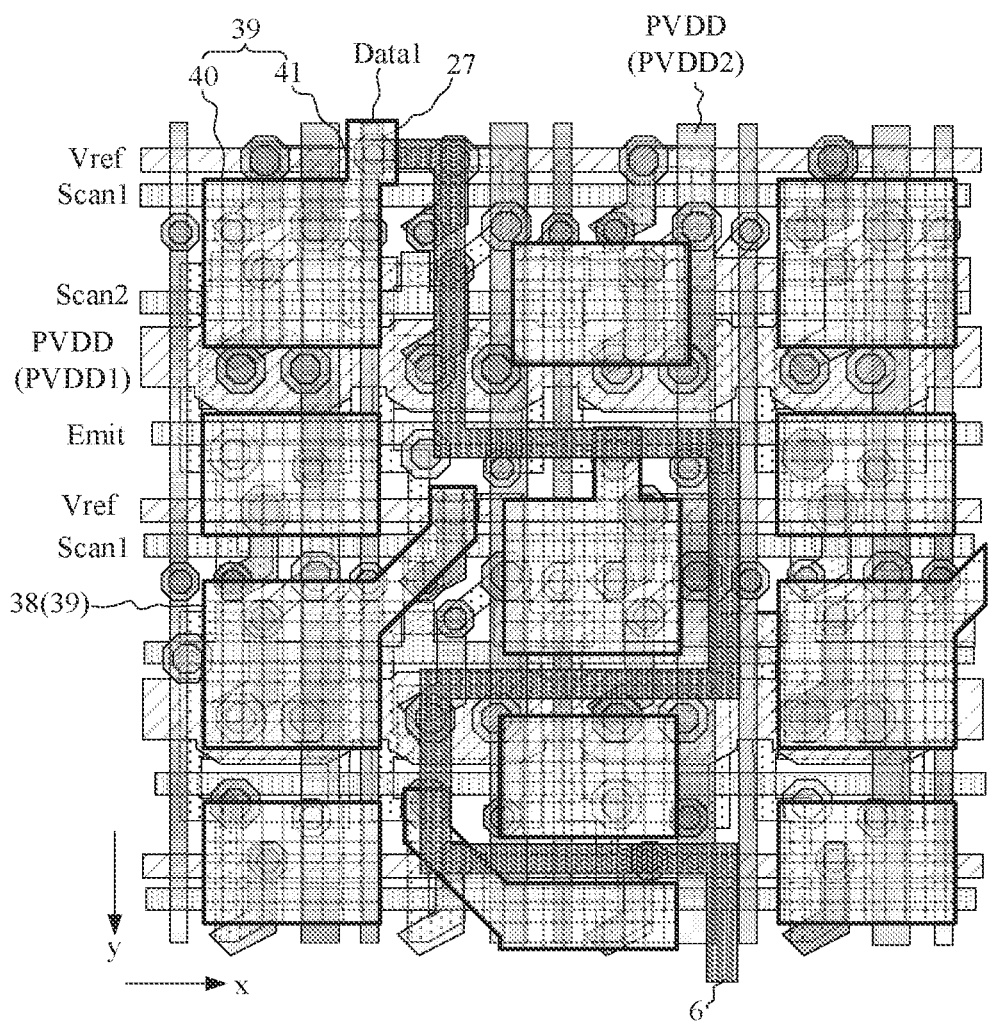
FIG. 39 is a top view of still another layer structure of a display panel according to an embodiment of the present disclosure.

FIG. 39 is a top view of still another layer structure of a display panel according to an embodiment of the present disclosure. As shown, there is a connection through-hole 27 formed between the connection lead 6 and the edge data line Data1. In some embodiments, the display panel includes a light-emitting element 38 located on the display panel. The light-emitting element 38 includes an anode 39, and at least part of a plurality of anodes 39 includes a main body 40 and a protruding part 41 protruding from the main body 40. In the direction perpendicular to the plane of the display panel, the protruding part 41 covers the connection through-hole 27, so that the protruding part 41 of the anode 39 can shield the connection through-hole 27 and prevent the connection through-hole 27 from being visible to human eyes when the display panel is screen-off.

Figure 40:
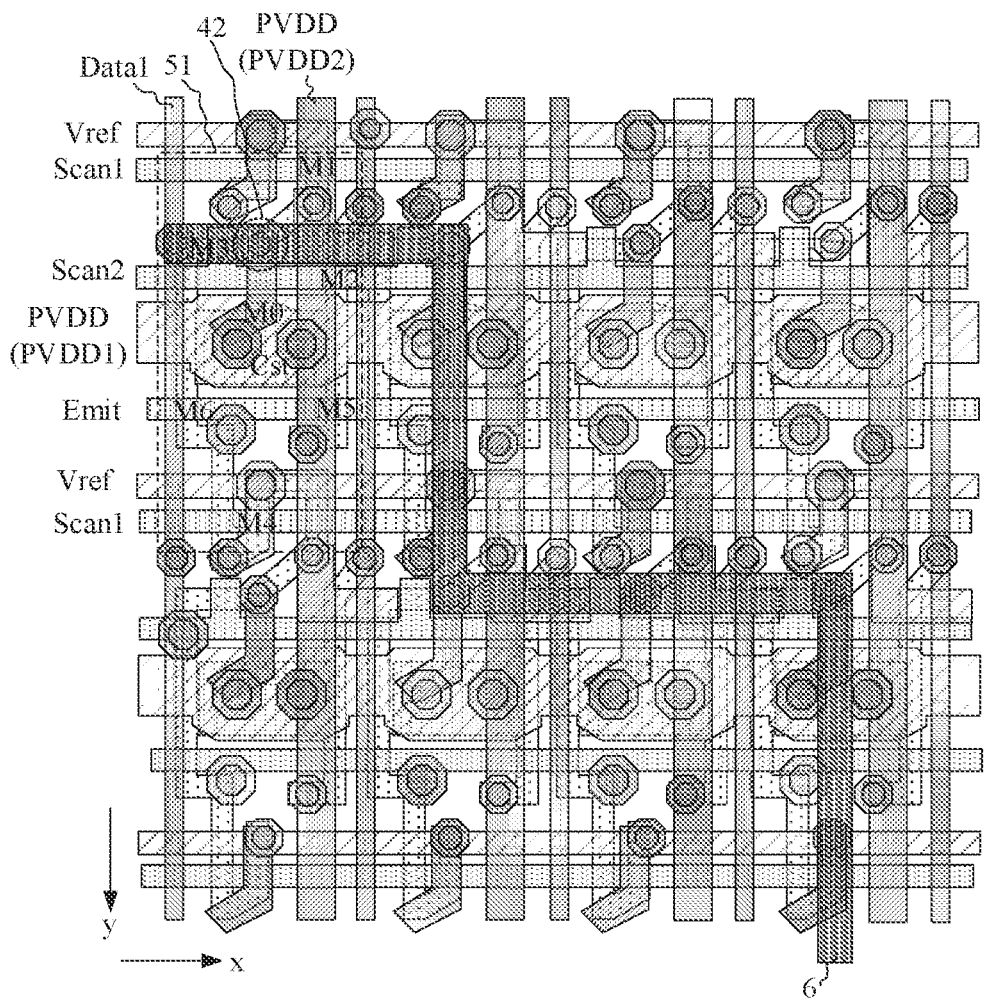
FIG. 40 is a top view of still another layer structure of a display panel according to an embodiment of the present disclosure.

With reference to FIG. 4, and as shown in FIG. 40 illustrating a top view of another layer structure of the display panel provided by the embodiment of the present disclosure, the display panel includes a pixel circuit 51 located in the display area 1, and the pixel circuit 51 includes a driving transistor M0 and a threshold compensation transistor M3. A connection node 42 is disposed between a gate of the driving transistor M0 and a second electrode of the threshold compensation transistor M3. In the direction perpendicular to the plane of the display panel, the connection lead 6 overlaps with part of the connection nodes 42.

When the display panel includes sub-pixels having different colors, the connection nodes 42 of the pixel circuits 51 in the sub-pixels having different colors have different couplings with other layers. For example, when the display panel includes a red sub-pixel for emitting red light, a green sub-pixel for emitting green light and a blue sub-pixel for emitting blue light, the parasitic capacitance of the connection node 42 of the pixel circuit 51 in the sub-pixel having a green color is generally small, which results in different attenuation of the data signals when the threshold transistors M3 in different color sub-pixels further transmit the data signals to the gates of the driving transistors M0, thus affecting uniformity of written voltages of the gates of the driving transistors M0. Therefore, in the embodiments of the present disclosure, the connection lead 6 overlaps with connection nodes 42 in the pixel circuits 51 of the sub-pixels having a green color, so as to increase parasitic capacitance of these connection nodes 42 by using coupling between the connection lead 6 and these connection nodes 42, and to further improve uniformity of data signal attenuation when the threshold transistors M3 transmit data signals to the driving transistors M0 in different color sub-pixels.

Figure 41:
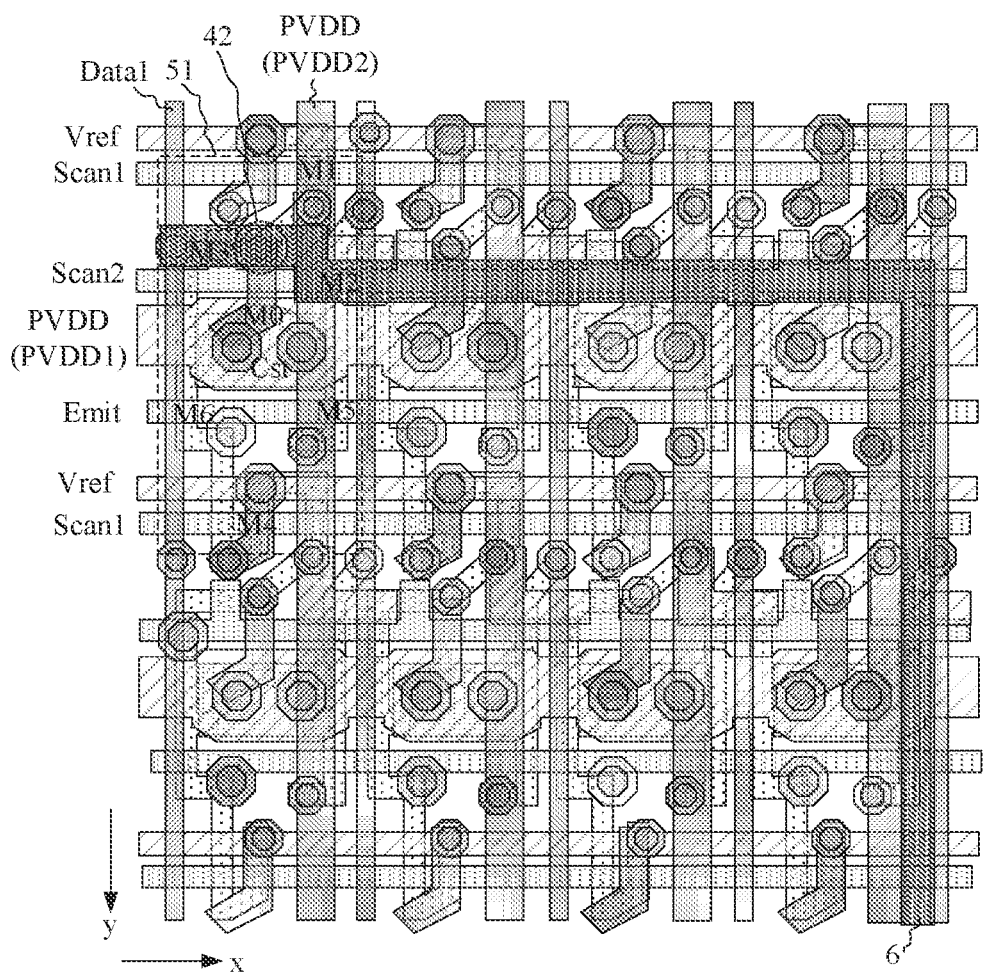
FIG. 41 is a top view of still another layer structure of a display panel according to an embodiment of the present disclosure.

FIG. 41 is a top view of still another layer structure of a display panel according to an embodiment of the present disclosure. As shown, the gate of the threshold compensation transistor M3 is electrically connected to the second scanning signal line Scan2, and in some embodiments, the connection lead 6 can overlap with the second scanning signal line Scan2 in the direction perpendicular to the plane of the display panel. In this case, the connection lead 6 overlaps with the connection node 42 and the second scanning signal line Scan2 at the same time, which can reduce an influence of a voltage jump of the second scanning signal line Scan2 on a potential of the connection node 42, so as to stabilize a voltage of the connection node 42, and improve stability of the driving transistor M0 in the operation state.

Figure 42:
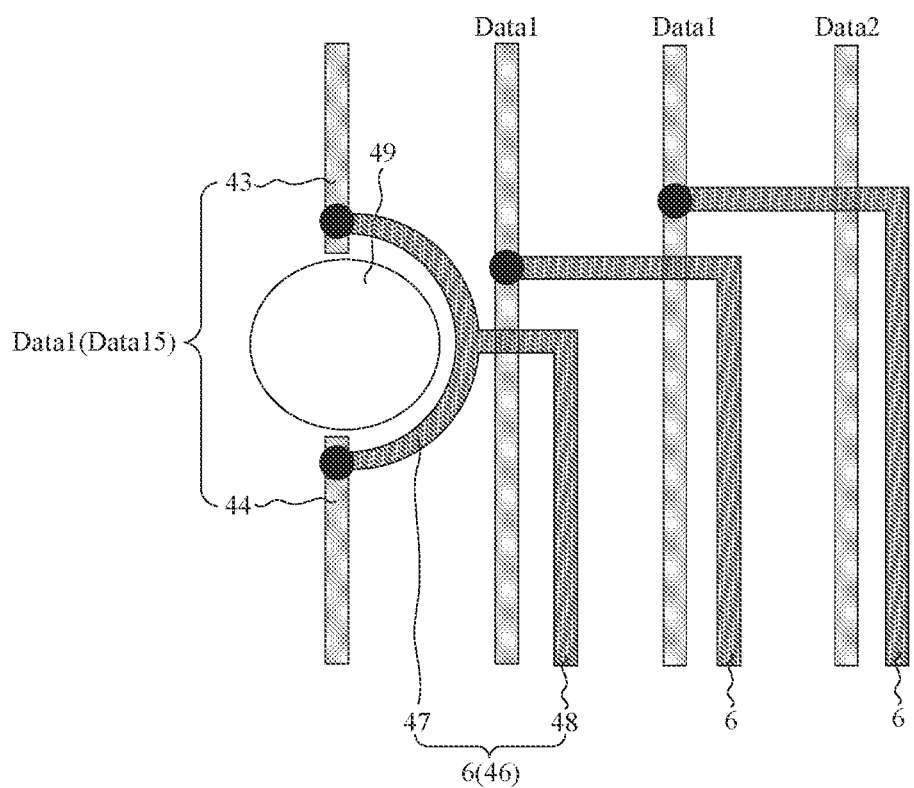
FIG. 42 is yet another partial top view of a display panel according to an embodiment of the present disclosure.

FIG. 42 is yet another partial top view of a display panel according to an embodiment of the present disclosure. As shown, the first display area 3 is provided with a light-transmitting hole 49 for fingerprint identification. The edge data lines Data1 include a fifth edge data line Data15. The fifth edge data line Data15 includes a first data line sub-segment 43 and a second data line sub-segment 44, and the first data line sub-segment 43 and the second data line sub-segment 44 are disconnected at the light-transmitting hole 49.

The connection leads 6 include a first connection lead 46 electrically connected to the fifth edge data line Data15, and the first connection lead 46 includes a first connection line sub-segment 47 and a second connection line sub-segment 48. The first connection line sub-segment 47 extends along an edge of the light-transmitting hole 49 and is electrically connected to the first data line sub-segment 43 and the second data line sub-segment 44, respectively, and the second connection line sub-segment 48 is electrically connected between the first connection line sub-segment 47 and the fan-out line 5.

In the above-mentioned configuration, the first connection lead 46 serves as a connection line between the fifth edge data line Data15 and the fan-out line 5, and also serves as a connection line between the first data line sub-segment 43 and the second data line sub-segment 44 which are disconnected at the fifth edge data line Data15, thus forming a signal transmission path between the first data line sub-segment 43 and the second data line sub-segment 44, thereby ensuring normal transmission of signals.

Figure 43:
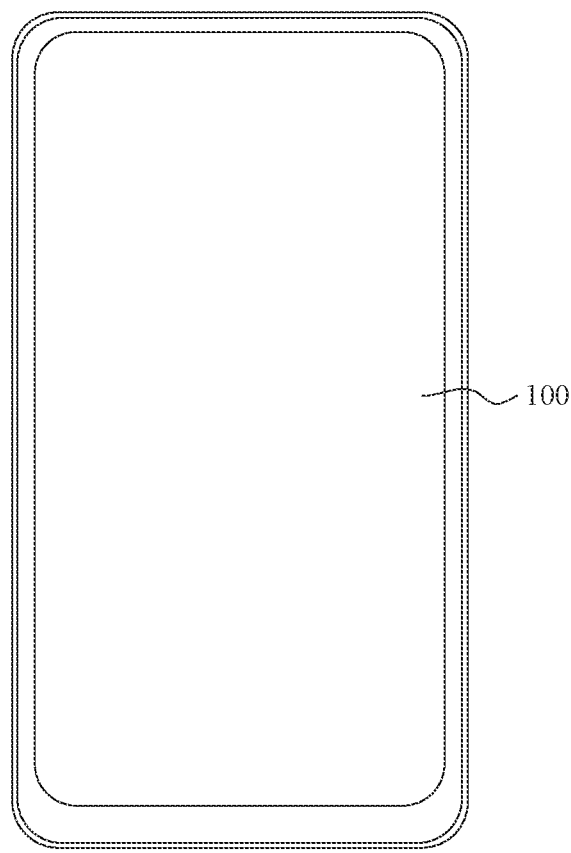
FIG. 43 is a schematic structural diagram of a display device according to an embodiment of the present disclosure.

Based on a same inventive concept, some embodiments of the present disclosure provide a display device. As shown in FIG. 43, which is a schematic structural diagram of a display device according to an embodiment of the present disclosure, the display device includes the display panel 100 described above. The structure of the display panel 100 has been described in detail in the above-mentioned embodiments, which will not be repeatedly described herein. It should be noted that, the display device shown in FIG. 43 is only a schematic illustration, and the display device can be any electronic device with a display function, such as a mobile phone, a tablet computer, a notebook computer, an electronic paper book or a television.

The above are merely preferred embodiments of the present disclosure, but not intended to limit the present disclosure. Any modifications, equivalents, improvements, etc. made within the concept of the present disclosure shall fall within a scope of the present disclosure.

Finally, it should be noted that the above embodiments are merely intended to illustrate technical schemes of the present disclosure, but not to limit it. Although the present disclosure has been described in detail with reference to the foregoing embodiments, it should be understood by ordinary skilled in the art that modifications can be made to the technical schemes described in the foregoing embodiments, or equivalent substitutions can be made to part or all of technical features thereof. These modifications or substitutions do not cause essence of corresponding technical schemes to depart from the scope of the technical schemes of the embodiments of the present disclosure.

What is claimed is:

1. A display panel, comprising:
data lines located in a display area of the display panel; and
fan-out lines electrically connected to the data lines and located in a non-display area of the display panel;
wherein the display area comprises first display areas and a second display area, wherein a first display area of the first display areas, the second display area and another first display area of the first display areas are arranged along a first direction, and the first display areas are adjacent to the non-display area;
wherein the data lines comprise edge data lines, the edge data lines are located in at least one of the first display areas and are electrically connected to the fan-out lines through connection leads, and the connection leads are located in the display area; and
wherein for a connection lead of the connection leads, the connection lead comprises a first end electrically connected to the edge data line and a second end electrically connected to the fan-out line; and the second end of the connection lead is located at a side, adjacent to the second display area, of the edge data line electrically connected to the connection lead.

2. The display panel according to claim 1, wherein at least one of the second ends of the connection leads is located in the second display area.

3. The display panel according to claim 1,
wherein the non-display area comprises a bending area, and a length of the bending area in a first direction of the non-display area is smaller than a length of the display area in the first direction of the display area; and
wherein the bending area comprises two first edges arranged opposite to each other in the first direction, and the second end of each of the connection leads is located between extension lines of the two first edges.

4. The display panel according to claim 1,
wherein the non-display area comprises a bending area and a first fan-out area, and the first fan-out area is located between the bending area and the display area; and
wherein the fan-out lines comprise first line segments located in the first fan-out area, and the first line segments comprises a type-A first line segment and a type-B first line segment; wherein the type-A first line segment and the type-B first line segment are arranged in different layers, and the type-A first line segment overlaps with the type-B first line segment in a direction perpendicular to a plane of the display panel.

5. The display panel according to claim 1, further comprising:
a substrate,
wherein the non-display area comprises a bending area and a second fan-out area, and the second fan-out area is located at a side of the bending area away from the display area; and wherein the second fan-out area is provided with a power bus for transmitting a power signal, and the power bus comprises a first bus part;
wherein the fan-out lines comprise second line segments located in the second fan-out area, and the second line segments overlap with the first bus part in a direction perpendicular to a plane of the display panel; and
wherein the second line segments comprise a type-A second line segment and a type-B second line segment, the type-A second line segment is located at a side of the first bus part facing the substrate, and the type-B second line segment is located at a side of the first bus part facing away from the substrate.

6. The display panel according to claim 5,
wherein the power bus further comprises a second bus part, the second bus part overlaps with the first bus part in the direction perpendicular to the plane of the display panel, and the second bus part is electrically connected to the first bus part; and
wherein the second bus part and the type-B second line segment are arranged in a same layer, and a spacing is defined by the second bus part and the type-B second line segment in the direction perpendicular to the plane of the display panel.

7. The display panel according to claim 5,
wherein the data lines further comprise an intermediate data line located in the second display area and electrically connected to the type-A second line segment, and the type-A second line segment comprises a first type-A second line segment and a second type-A second line segment arranged in different layers; and
wherein the edge data line is electrically connected to the type-B second line segment, and the type-B second line segment and the connection lead are arranged in a same layer.

8. The display panel according to claim 5,
wherein an electric resistivity of the type-A second line segment is greater than an electric resistivity of the type-B second line segment;
wherein the data lines further comprise an intermediate data line located in the second display area, the intermediate data line comprises a first intermediate data line, and a spacing is formed between the first intermediate data line and the connection lead in the direction perpendicular to the plane of the display panel; and
wherein the first intermediate data line is electrically connected to the fan-out line comprising the type-A second line segment.

9. The display panel according to claim 5,
wherein an electric resistivity of the type-A second line segment is greater than an electric resistivity of the type-B second line segment;
wherein the data lines further comprise an intermediate data line located in the second display area, the intermediate data line comprises a second intermediate data line, and the second intermediate data line overlaps with the connection lead in the direction perpendicular to the plane of the display panel; and
wherein at least one of the edge data line or the second intermediate data line is electrically connected to the fan-out line comprising the type-B second line segment.

10. The display panel according to claim 1,
wherein the data lines further comprise an intermediate data line located in the second display area, the intermediate data line comprises a first intermediate data line, and a spacing is formed between the first intermediate data line and the connection lead in a direction perpendicular to a plane of the display panel; and
wherein the fan-out lines comprise at least one first fan-out line, a first fan-out line of the at least one first fan-out line is electrically connected to the first intermediate data line, and a first fan-out line of the at least one first fan-out line extends as a non-linear shape.

11. The display panel according to claim 1,
wherein the edge data lines comprise a first edge data line and a second edge data line, and an overlapping area between the first edge data line and the connection lead is smaller than an overlapping area between the second edge data line and the connection lead in a direction perpendicular to a plane of the display panel; and
wherein a length of the connection lead electrically connected to the first edge data line is larger than a length of the connection lead electrically connected to the second edge data line.

12. The display panel according to claim 1,
wherein the edge data lines comprise a third edge data line and a fourth edge data line, the third edge data line is located at a side of the fourth edge data line away from the second display area, and a length of the third edge data line is smaller than a length of the fourth edge data line; and
wherein a length of the connection lead electrically connected to the third edge data line is larger than a length of the connection lead electrically connected to the fourth edge data line.

13. The display panel according to claim 1,
wherein the non-display area comprises a bending area, and the display area comprises a first display edge adjacent to the bending area; and
wherein connection through-holes are formed between the connection leads and the edge data lines, and at least two of the connection through-holes have different shortest distances from an extension line of the first display edge in a direction perpendicular to a plane of the display panel.

14. The display panel according to claim 1,
wherein the second end of each of the connection leads is located in the first display area; and
wherein the first display area is provided with $1^{st}$ to $n^{th}$ edge data lines arranged along the first direction, the second ends of n connection leads electrically connected to the $1^{st}$ to the $n^{th}$ edge data lines are arranged along the first direction, and the connection lead comprising an $i^{th}$ second end is electrically connected to an $i^{th}$ edge data line, where both i and n are positive integers and i is smaller than or equal to n.

15. The display panel according to claim 1, further comprising:
   a first positive power signal line located in the display area;
   a second positive power signal line located in the display area;
   a scanning signal line located in the display area;
   a reset signal line located in the display area; and
   a light-emitting control signal line located in the display area,
   wherein the scanning signal line, the reset signal line, the light-emitting control signal line and the first positive power signal line each extend in the first direction;
   wherein the second positive power signal line and the data line each extend in a second direction intersecting with the first direction;
   wherein a connection lead of the connection leads comprises a first lead segment extending in the first direction and a second lead segment extending in the second direction, and, in a direction perpendicular to a plane of the display panel, the first lead segment overlaps with at least one of the scanning signal line, the reset signal line, the light-emitting control signal line or the first positive power signal line, and/or at least one of the second lead segments overlaps with at least one of the second positive power signal line or the data line.

16. The display panel according to claim 1, further comprising:
   a light-emitting element located in the display area,
   wherein the light-emitting element comprises an anode, and a spacing is formed between the connection lead and the anode in a direction perpendicular to a plane of the display panel.

17. The display panel according to claim 1,
   wherein connection through-holes are formed between the connection leads and the edge data lines; and
   wherein the display panel further comprises light-emitting elements located on the display panel, wherein a light-emitting element of the light-emitting elements comprises an anode, at least one of the anodes of the light-emitting elements comprises a main body and a protruding part protruding from the main body, and the protruding part covers a connection through hole of the connection through-holes in a direction perpendicular to a plane of the display panel.

18. The display panel according to claim 1, further comprising
   pixel circuits located in the display area,
   wherein a pixel circuit of the pixel circuit comprises a driving transistor and a threshold compensation transistor, and a connection node is formed between a gate of the driving transistor and a second electrode of the threshold compensation transistor; and
   wherein in a direction perpendicular to a plane of the display panel, the connection leads overlap with at least one of the connection nodes in the pixel circuits.

19. The display panel according to claim 1,
   wherein the first display area comprises a light-transmitting hole for fingerprint identification;
   wherein the edge data lines comprise a fifth edge data line, the fifth edge data line comprises a first data line sub-segment and a second data line sub-segment, the first data line sub-segment and the second data line sub-segment are disconnected at the light-transmitting hole; and
   wherein the connection leads comprise a first connection lead electrically connected to the fifth edge data line, wherein the first connection lead comprises a first connection line sub-segment and a second connection line sub-segment, the first connection line sub-segment extends along an edge of the light-transmitting hole and is electrically connected to the first data line sub-segment and the second data line sub-segment respectively, and the second connection line sub-segment is electrically connected between the first connection line sub-segment and the fan-out line.

20. A display device, comprising a display panel comprising:
   data lines located in a display area of the display panel; and
   fan-out lines electrically connected to the data lines and located in a non-display area of the display panel;
   wherein the display area comprises first display areas and a second display area, wherein a first display area of the first display areas, the second display area and another first display area of the first display areas are arranged along a first direction, and the first display areas are adjacent to the non-display area;
   wherein the data lines comprise edge data lines located in at least one of the first display areas and electrically connected to the fan-out lines through connection leads, and the connection leads are located in the display area; and
   wherein for a connection lead of the connection leads, the connection lead comprises a first end electrically connected to the edge data line and a second end electrically connected to the fan-out line; and the second end of the connection lead is located at a side, adjacent to the second display area, of the edge data line electrically connected to the connection lead.

* * * * *